(12) United States Patent
Kim et al.

(10) Patent No.: US 7,911,835 B2
(45) Date of Patent: Mar. 22, 2011

(54) PROGRAMMING AND READING FIVE BITS OF DATA IN TWO NON-VOLATILE MEMORY CELLS

(75) Inventors: Doo-gon Kim, Gyeonggi-do (KR); Ki-tae Park, Gyeonggi-do (KR); Yeong-taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 375 days.

(21) Appl. No.: 11/859,465

(22) Filed: Sep. 21, 2007

(65) Prior Publication Data

US 2008/0084740 A1     Apr. 10, 2008

(30) Foreign Application Priority Data

Oct. 4, 2006   (KR) .................. 10-2006-0097602
Jan. 5, 2007   (KR) .................. 10-2007-0001627

(51) Int. Cl.
*G11C 16/04*     (2006.01)
(52) U.S. Cl. ......... 365/185.03; 365/185.17; 365/185.24; 365/185.33; 365/184
(58) Field of Classification Search ............. 365/185.03, 365/185.17, 185.24, 185.33, 184
See application file for complete search history.

(56) References Cited

U.S. PATENT DOCUMENTS

| | | | |
|---|---|---|---|
| 6,259,624 B1 * | 7/2001 | Nobukata | 365/185.03 |
| 6,530,058 B1 | 3/2003 | Visconti | |
| 6,807,610 B2 * | 10/2004 | Frayer | 711/156 |
| 6,816,407 B2 | 11/2004 | Rolandi | |
| 6,996,004 B1 | 2/2006 | Fastow et al. | |
| 2006/0140011 A1 | 6/2006 | Fong et al. | |
| 2009/0109746 A1 * | 4/2009 | Aritome | 365/185.03 |

* cited by examiner

*Primary Examiner* — Pho M Luu
*Assistant Examiner* — Tha-O Bui
(74) *Attorney, Agent, or Firm* — Myers Bigel Sibley & Sajovec, P.A.

(57) ABSTRACT

Non-volatile memory devices and methods of programming the non-volatile memory devices use six threshold voltage levels. Data also may be read from the non-volatile memory devices. The non-volatile memory devices include a first non-volatile memory cell and a second non-volatile memory cell, each of which can be programmed with first through sixth threshold voltage levels that sequentially increase. Programming includes first, second and third data bit program operations. In the first and second data bit program operation, the first and second non-volatile memory cells are programmed with the first or second threshold voltage level in order to store first and second bits of data. In the third data bit program operation, the first non-volatile memory cell is programmed with the third or fourth threshold voltage level according to the first and second bits of the data in order to store a third bit of the data. Fourth and fifth data bit program operations also may be provided.

25 Claims, 15 Drawing Sheets

(a)
1st & 2nd PGM (b)
3rd & 5th PGM (c)
4th PGM

PROGRAMMING AND READING FIVE BITS OF DATA IN TWO NON-VOLATILE MEMORY CELLS

CROSS-REFERENCE TO RELATED PATENT APPLICATIONS

This application claims the benefit under 35 USC §119 of Korean Patent Application No. 10-2006-0097602, filed Oct. 4, 2006, and Korean Patent Application No. 10-2007-0001627, filed on Jan. 5, 2007, the disclosures of both of which are hereby incorporated herein by reference in their entirety as if set forth fully herein.

FIELD OF THE INVENTION

The present invention relates to programming a non-volatile memory device and reading data from the non-volatile memory device, and more particularly, to programming a non-volatile memory device by using 6 threshold voltage levels and reading data from the non-volatile memory device by using the 6 threshold voltage levels.

BACKGROUND OF THE INVENTION

In order to store data of 2 or more bits, conventional non-volatile memory devices include 4-level non-volatile memory cells, each having 4 threshold voltage levels, or 8-level non-volatile memory cells, each having 8 threshold voltage levels. Since a 4-level non-volatile memory cell is programmed using four threshold voltage levels, the 4-level non-volatile memory cell is able to store 2-bit data. Since an 8-level non-volatile memory cell is programmed using eight threshold voltage levels, the 8-level non-volatile memory cell is able to store 3-bit data.

SUMMARY OF THE INVENTION

Some embodiments of the present invention provide methods of programming a non-volatile memory device that includes a first non-volatile memory cell and a second non-volatile memory cell, each of which can be programmed with first through sixth threshold voltage levels that sequentially increase. According to some embodiments, five bits of data are programmed in the first and second non-volatile memory cells by programming an initial subset of at least two of the five bits of data into the first and second non-volatile memory cells and then programming a remaining subset of the five bits of data into the first and second non-volatile memory cells according to threshold voltage levels at which the initial subset of at least two of the five bits have been programmed into the first and second non-volatile memory cells. Related non-volatile memory cells, including controllers that are configured to program five bits of data, may also be provided according to other embodiments of the present invention. Moreover, methods of reading a non-volatile memory device in which five bits of data have been programmed in the first and second non-volatile memory cells, and related non-volatile memory devices, are also provided according to other embodiments of the invention.

According to some embodiments of the present invention, there are provided methods of programming a non-volatile memory device comprising a first non-volatile memory cell and a second non-volatile memory cell, each of which can be programmed with first through sixth threshold voltage levels that sequentially increase. These methods may comprise a first program operation for programming the first and second non-volatile memory cells with one of the first threshold voltage level or the second threshold voltage level in order to store first and second bits of data, and a second program operation for programming one of the first or second non-volatile memory cells with one of the third through sixth threshold voltage levels in order to store third through fifth bits of the data according to a threshold voltage level with which the first and second bits of the data have been programmed.

BRIEF DESCRIPTION OF THE DRAWINGS

The above and other features and advantages of the present invention will become more apparent by describing in detail exemplary embodiments thereof with reference to the attached drawings in which:

FIG. 3, show diagrams for further illustrating the program operations according to embodiments illustrated in FIG. 2;

FIG. 11, illustrate a first program operation for programming first through third bits of data in embodiments of FIG. 10;

DETAILED DESCRIPTION OF THE INVENTION

Figure 1A:
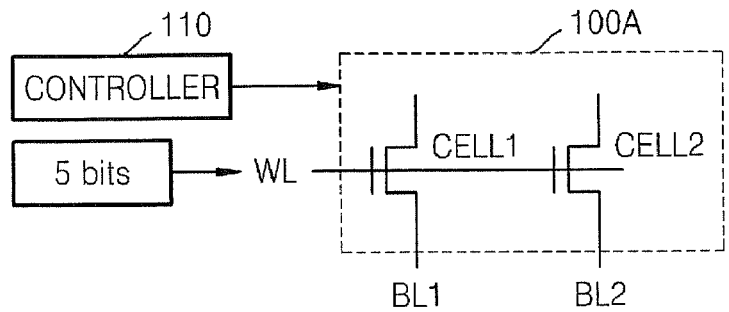
FIGS. 1A and 1B are circuit diagrams of a non-volatile memory device according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. In contrast, the term "directly" means that there are no intervening elements. As used herein, the term "and/or" includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes," "including," "have" and/or "having" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described below with reference to block diagrams and/or flowchart illustrations of methods and/ or apparatus (systems and/or devices) according to embodiments of the invention. It is understood that a block of the block diagrams and/or flowchart illustrations, and combinations of blocks in the block diagrams and/or flowchart illustrations, can be implemented by hardware and may also include computer program instructions, which execute via a processor and/or other programmable data processing apparatus to create means (functionality) and/or structure for implementing the functions/acts specified in the block diagrams and/or flowchart block or blocks. Accordingly, the present invention may be embodied in hardware and also may include software (including firmware, resident software, micro-code, etc.).

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

As used herein, "data" refers to any digital information to be stored in a non-volatile memory device, regardless of the source or meaning of the information. Data may also be referred to synonymously herein as "page data". Moreover, methods of programming and reading non-volatile memory devices may be implemented by a controller, which may be designed to implement the program and/or read operations that are described herein. The controller may include logic and/or processor circuits that, in some embodiments, may executed a stored program, and that are configured to perform the programming and reading operations described herein. The design of controllers for non-volatile memory devices is well known to those having skill in the art and need not be described further herein.

Hereinafter, it is assumed that a non-volatile memory cell according to the present invention has 6 threshold voltage levels. However, the number of threshold voltage levels that the non-volatile memory cell according to the present invention is not limited to 6. For example, the non-volatile memory cell according to the present invention may have 12 threshold voltage levels.

Figure 1B:
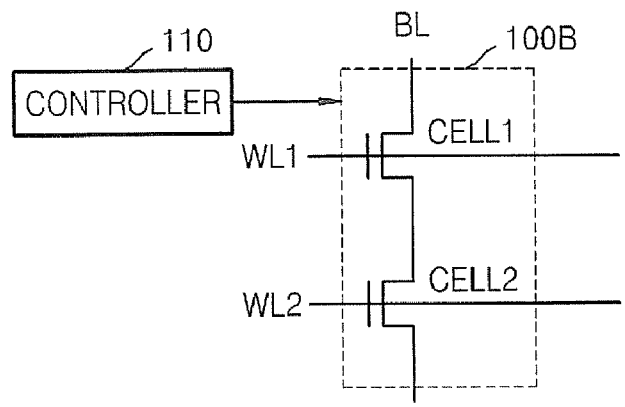

FIGS. 1A and 1B are respectively circuit diagrams of a non-volatile memory device 100A and 100B according to embodiments of the present invention.

Figure 1C:
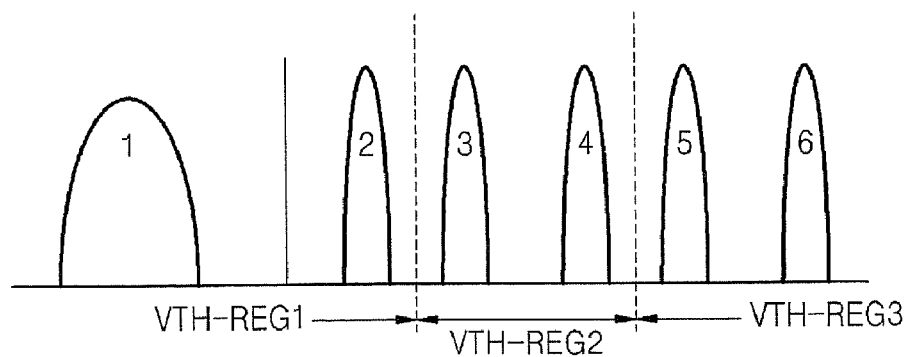
FIG. 1C illustrates 6 threshold voltage levels of a non-volatile memory cell of the non-volatile memory device shown in FIGS. 1A and 1B.

FIG. 1C illustrates 6 threshold voltage levels that a non-volatile memory cell of the non-volatile memory device 100A or 100B shown in FIGS. 1A and 1B has.

Referring to FIG. 1C, first and second non-volatile memory cells CELL1 and CELL2 included in each of the non-volatile memory devices 100A and 100B may be programmed to have one of first through sixth threshold voltage levels that sequentially increase. More specifically, the sixth threshold voltage level is the highest, and the first threshold voltage level is the lowest. The non-volatile memory device 100A or 100B can program 5-bit data (also referred to herein as 5-page data) by using the two non-volatile memory cells CELL1 and CELL2 each having 6 threshold voltage levels.

The first and second non-volatile memory cells CELL1 and CELL2 may be connected to the same wordline or bitline. In FIG. 1A, the first and second non-volatile memory cells CELL1 and CELL2 are connected to a given wordline. In FIG. 1B, the first and second non-volatile memory cells CELL1 and CELL2 are connected to a given bitline. A controller 110 also may be provided to control programming and/or reading operations described herein.

Figure 2:
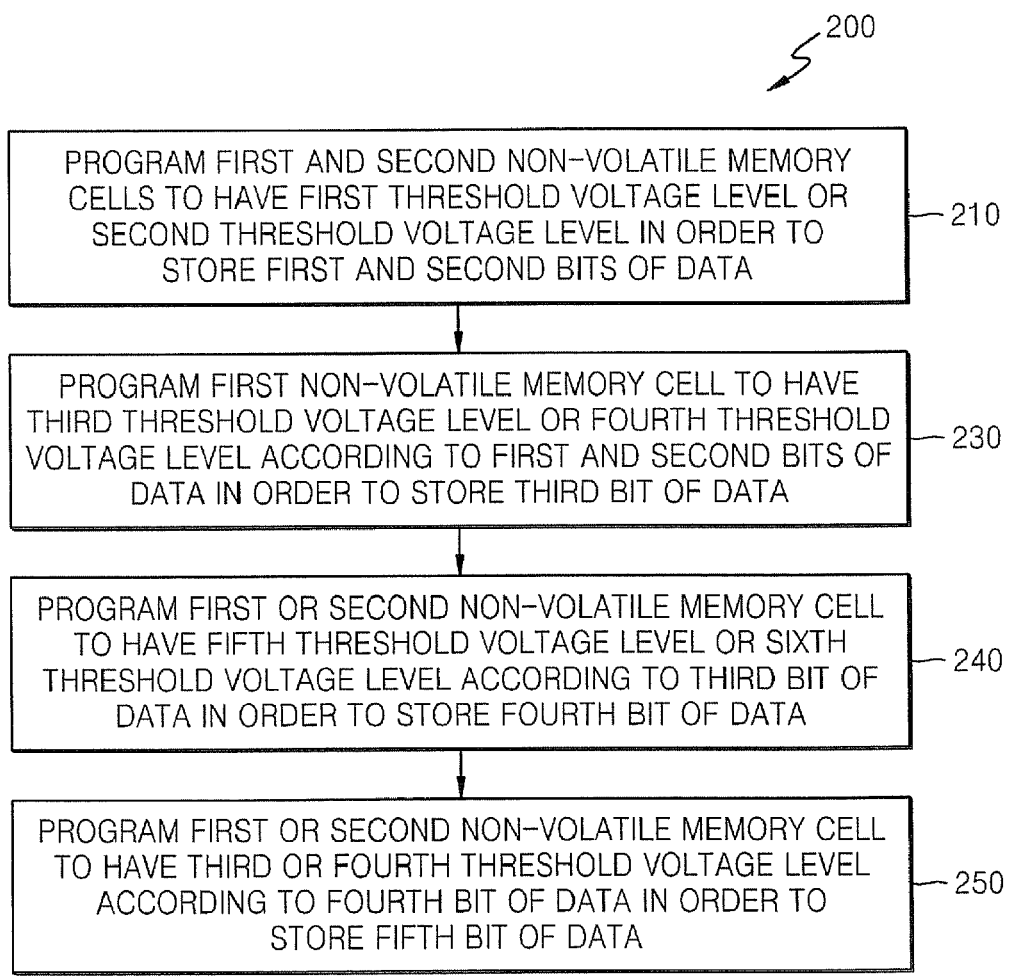
FIG. 2 is a flowchart of programming operations that may be performed according to first embodiments of the present invention.

FIG. 2 is a flowchart of a program operations 200 according to first embodiments of the present invention.

Referring to FIG. 2, the program operations 200 include first and second bits of the data bit program operation 210, a third data bit program operation 230, a fourth data bit program operation 240, and a fifth data bit program operation 250.

In the first and second bits of the data bit program operation 210, in order to store first and second bits of data, the first and second non-volatile memory cells are programmed to have a first threshold voltage level or a second threshold voltage level. In the third data bit program operation 230, in order to store a third bit of the data, the first non-volatile memory cell is programmed to have a third threshold voltage level or a fourth threshold voltage level according to the first and second bits of the data. In the fourth data bit program operation 240, in order to store a fourth bit of the data, the first non-volatile memory cell or the second non-volatile memory cell is programmed to have a fifth threshold voltage level or a sixth threshold voltage level according to the third bit of the data. In the fifth data bit program operation 250 in order to store a fifth bit of the data, the first non-volatile memory cell or the second non-volatile memory cell is programmed to have a third threshold voltage level or a fourth threshold voltage level according to the fourth bit of the data.

In the third data bit program operation 230, to store the third bit of the data, the first non-volatile memory cell may be programmed with the third threshold voltage level or the fourth threshold voltage level according to the threshold voltage level with which the first non-volatile memory cell has been programmed in operation 210. In the fourth data bit program operation 240, to store the fourth bit of the data, the first non-volatile memory cell or the second non-volatile memory cell may be programmed with the fifth threshold voltage level or the sixth threshold voltage level according to the threshold voltage level with which the first non-volatile memory cell has been programmed. In the fifth data bit program operation 250, to store the fifth bit of the data, the first non-volatile memory cell or the second non-volatile memory cell may be programmed with the third threshold voltage level or the fourth threshold voltage level according to the threshold voltage level with which the second non-volatile memory cell has been programmed.

Figure 3A:
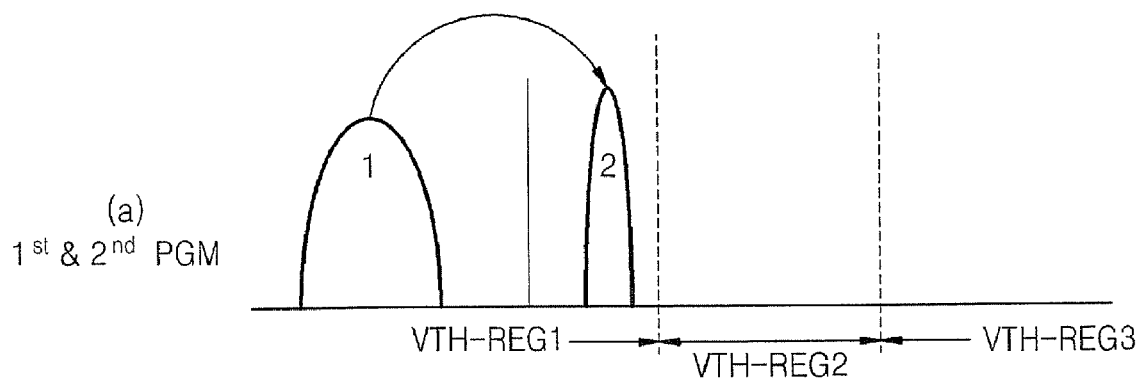
FIGS. 3A, 3B and 3C, which collectively form
Figure 3B:
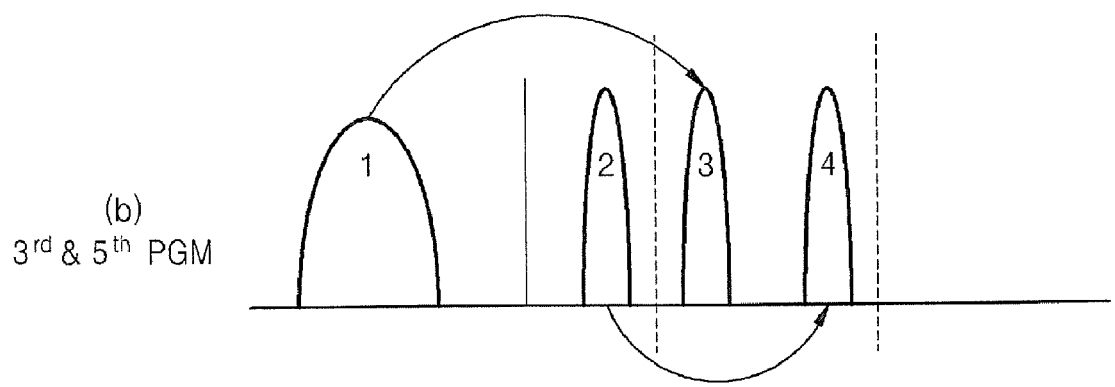
Figure 3C:
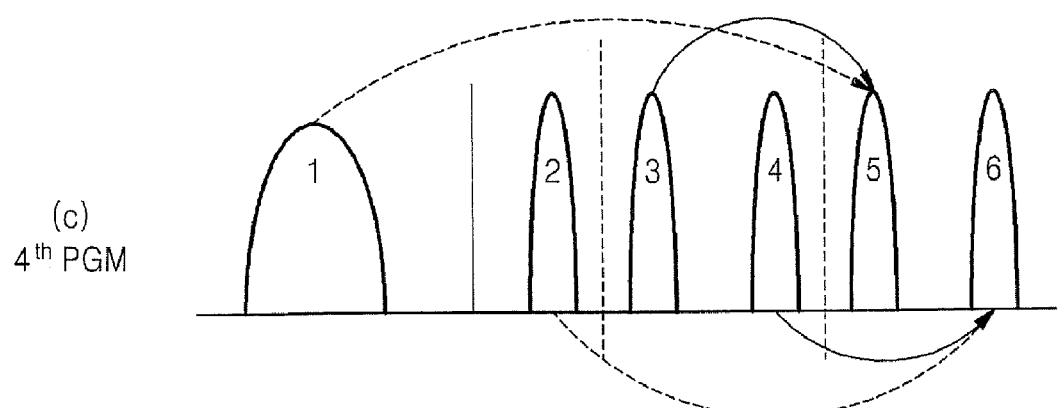

FIGS. 3A, 3B and 3C, which collectively form FIG. 3, show diagrams for further illustrating the programming 200 according to the embodiments illustrated in FIG. 2.

Referring to FIGS. 2 and 3A, in the first and second bits of the data bit program operation 210, the first data are programmed with the first threshold voltage level and the second threshold voltage level in the first memory cell CELL1. Also, the second data are programmed with the first threshold voltage level and the second threshold voltage level in the second memory cell CELL2. A single non-volatile memory cell includes the threshold voltage levels. Thus, the two non-volatile memory cells can include four threshold voltage level combinations, whereby the first and second bits of the data can be written to the two non-volatile memory cells.

Referring to FIGS. 2 and 3B, in the third data bit program operation 230, to store the third bit of the data, the first non-volatile memory cell may be programmed with a combination of the first threshold voltage level and the third threshold voltage level or a combination of the second threshold voltage level and the fourth threshold voltage level. For example, when the logic level of the third bit of the data is 0, the first non-volatile memory cell may be programmed with the third threshold voltage level or the fourth threshold voltage level. On the other hand, when the logic level of the third bit of the data is 1, the first non-volatile memory cell may be programmed with the first threshold voltage level or the second threshold voltage level.

More specifically, in the third data bit program operation 230, when the threshold voltage level with which the first non-volatile memory cell has been programmed is the first threshold voltage level, to store the third bit of the data, the first non-volatile memory cell may be programmed with the first threshold voltage level or the third threshold voltage level according to the third bit of the data. On the other hand, when the threshold voltage level with which the first non-volatile memory cell has been programmed is the second threshold voltage level, to store the third bit of the data, the first non-volatile memory cell may be programmed with the second threshold voltage level or the fourth threshold voltage level according to the third bit of the data. When the third bit of the data is "0", the first non-volatile memory cell may be programmed with the third threshold voltage level or the fourth threshold voltage level. On the other hand, when the third bit of the data is "1", the first non-volatile memory cell may be programmed with the first threshold voltage level or the second threshold voltage level. For example, when the threshold voltage level with which the first non-volatile memory cell has been programmed is the first threshold voltage level and the third bit of the data is "0", the first non-volatile memory cell is programmed with the third threshold voltage level.

Referring to FIGS. 2 and 3C, in the fourth data bit program operation 240, to store the fourth bit of the data, the first non-volatile memory cell may be programmed with a combination of the third threshold voltage level and the fifth threshold voltage level or a combination of the fourth threshold voltage level and the sixth threshold voltage level. Alternatively, to store the fourth bit of the data, the second non-volatile memory cell may be programmed with a combination of the first threshold voltage level and the fifth threshold voltage level or a combination of the second threshold voltage level and the sixth threshold voltage level. If the logic level of the fourth bit of the data is 0, the first non-volatile memory cell or the second non-volatile memory cell may be programmed with the fifth threshold voltage level or the sixth threshold voltage level.

To be more specific, in the fourth data bit program operation 240, when the threshold voltage level with which the first non-volatile memory cell has been programmed is the third threshold voltage level, to store the fourth bit of the data, the first non-volatile memory cell may be programmed with the third threshold voltage level or the fifth threshold voltage level according to the fourth bit of the data. When the threshold voltage level with which the first non-volatile memory cell has been programmed is the fourth threshold voltage level, to store the fourth bit of the data, the first non-volatile memory cell may be programmed with the fourth threshold voltage level or the sixth threshold voltage level according to the fourth bit of the data. When the threshold voltage level with which the first non-volatile memory cell has been programmed is the first threshold voltage level, to store the fourth bit of the data, the second non-volatile memory cell may be programmed with the first threshold voltage level or the fifth threshold voltage level according to the fourth bit of the data. When the threshold voltage level with which the first non-volatile memory cell has been programmed is the second threshold voltage level, to store the fourth bit of the data, the second non-volatile memory cell may be programmed with the second threshold voltage level or the sixth threshold voltage level according to the fourth bit of the data.

In the fourth data bit program operation 240, when the threshold voltage level with which the first non-volatile memory cell has been programmed is the third threshold voltage level or the fourth threshold voltage level and the fourth bit of the data is "0", to store the fourth bit of the data, the first non-volatile memory cell may be programmed with the fifth threshold voltage level or the sixth threshold voltage level respectively. When the threshold voltage level with which the first non-volatile memory cell has been programmed is the third threshold voltage level or the fourth threshold voltage level and the fourth bit of the data is "1", to store the fourth bit of the data, the first non-volatile memory cell may be programmed with the third threshold voltage level or the fourth threshold voltage level respectively. When the threshold voltage level with which the first non-volatile memory cell has been programmed is the first threshold voltage level or the second threshold voltage level and the fourth bit of the data is "0", to store the fourth bit of the data, the first non-volatile memory cell may be programmed with the fifth threshold voltage level or the sixth threshold voltage level respectively. When the threshold voltage level with which the first non-volatile memory cell has been programmed is the first threshold voltage level or the second threshold voltage level and the fourth bit of the data is "1", to store the fourth bit of the data, the first non-volatile memory cell may be programmed with the first threshold voltage level or the second threshold voltage level respectively.

Referring to FIGS. 2 and 3B, in the fifth data bit program operation 250, to store the fifth bit of the data, the first non-volatile memory cell may be programmed with a combination of the first threshold voltage level and the third threshold voltage level or a combination of the second threshold voltage level and the fourth threshold voltage level. Alternatively, to store the fifth bit of the data, the second non-volatile memory cell may be programmed with a combination of the first threshold voltage level and the third threshold voltage level or a combination of the second threshold voltage level and the fourth threshold voltage level. If the logic level of the fifth bit of the data is 0, the first or second non-volatile memory cell may be programmed with the third threshold voltage level or the fourth threshold voltage level.

In the fifth data bit program operation 250, when the threshold voltage level with which the second non-volatile memory cell has been programmed is the fifth threshold voltage level, to store the fifth bit of the data, the first non-volatile memory cell may be programmed with the first threshold voltage level or the third threshold voltage level according to the fifth bit of the data. When the threshold voltage level with which the second non-volatile memory cell has been programmed is the sixth threshold voltage level, to store the fifth bit of the data, the first non-volatile memory cell may be programmed with the second threshold voltage level or the fourth threshold voltage level according to the fifth bit of the data. When the threshold voltage level with which the second non-volatile memory cell has been programmed is the first threshold voltage level, to store the fifth bit of the data, the second non-volatile memory cell may be programmed with the first threshold voltage level or the third threshold voltage level according to the fifth bit of the data. When the threshold voltage level with which the second non-volatile memory cell has been programmed is the second threshold voltage level, to store the fifth bit of the data, the second non-volatile memory cell may be programmed with the second threshold voltage level or the fourth threshold voltage level according to the fifth bit of the data.

In the fifth data bit program operation 250, when the fifth bit of the data is "0", the first non-volatile memory cell or the second non-volatile memory cell may be programmed with the third threshold voltage level or the fourth threshold voltage level. On the other hand, when the fifth bit of the data is "1", the first non-volatile memory cell or the second non-volatile memory cell may be programmed with the first threshold voltage level or the second threshold voltage level.

Figure 4:
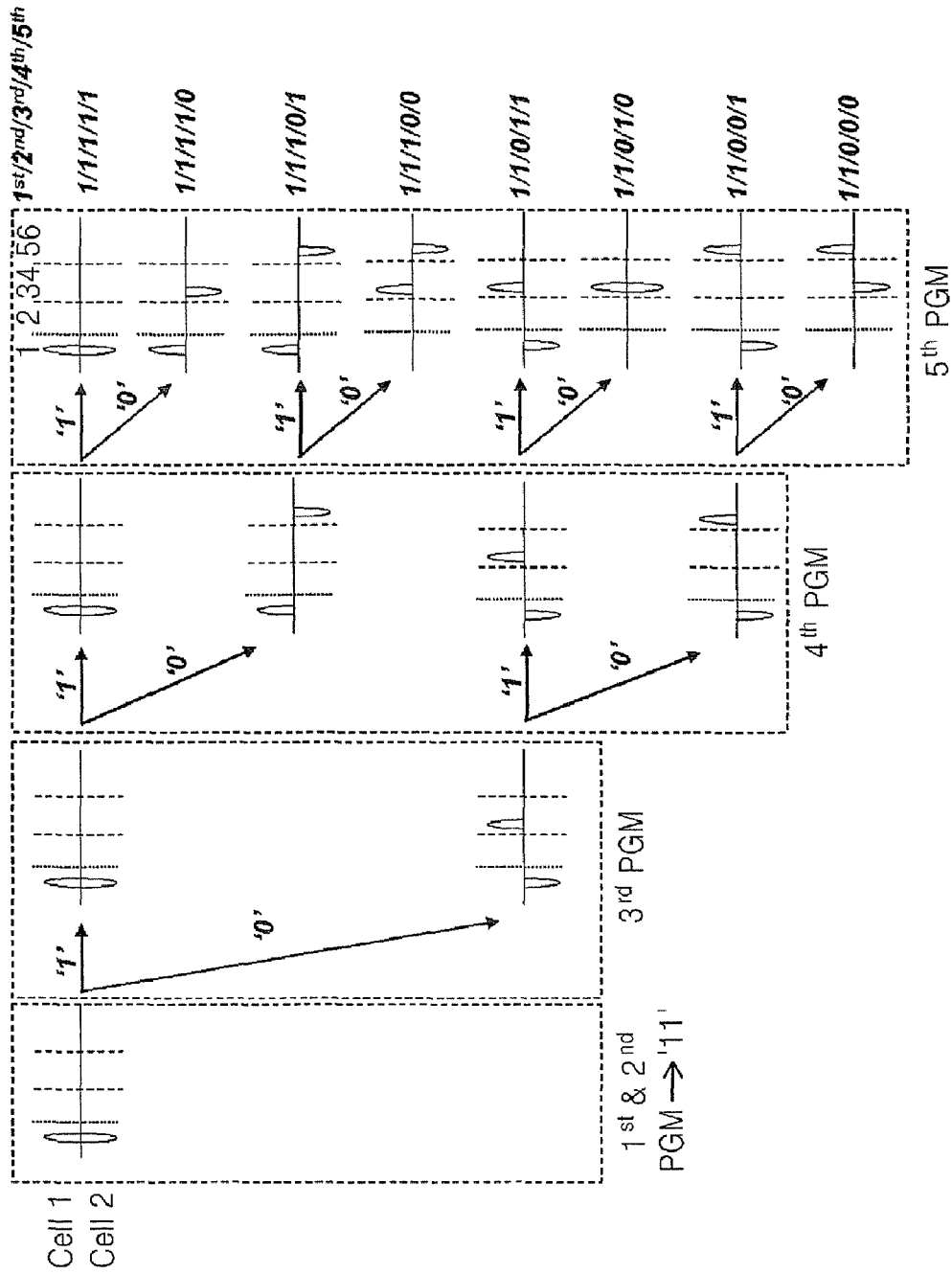
FIG. 4 shows diagrams for further illustrating the program operations according to embodiments illustrated in FIG. 2, when first and second bits of data are "11"

FIG. 4 illustrates the programming 200 according to the embodiments illustrated in FIG. 2, when the first and second bits of the data are "11".

Referring to FIG. 4, in the first and second bits of the data bit program operation 210, to store the first and second bits of the data, which are "11", the first and second non-volatile memory cells are programmed with the first threshold voltage level. In the third data bit program operation 230, when the third bit of the data is "0", the first non-volatile memory cell, which has been programmed with the first level, is programmed with the third threshold voltage level. Meanwhile, the second non-volatile memory cell is not programmed. When the third bit of the data is "1", the first non-volatile memory cell is programmed with the first threshold voltage level. That is, the threshold voltage of the first non-volatile memory cell is not varied. In the fourth data bit program operation 240, when the third bit of the data is "1" and the fourth bit of the data is "0", the second non-volatile memory cell is programmed with the fifth threshold voltage level. On the other hand, when the third bit of the data is "0" and the fourth bit of the data is "0", the first non-volatile memory cell is programmed with the fifth threshold voltage level.

In the fifth data bit program operation 250, when the third bit of the data is "1", the fourth bit of the data is "1", and the fifth bit of the data is "0", the second non-volatile memory cell is programmed with the third threshold voltage level. When the third bit of the data is "1", the fourth bit of the data is "0", and the fifth bit of the data is "0", the first non-volatile memory cell is programmed with the third threshold voltage level. When the third bit of the data is "0", the fourth bit of the data is "1", and the fifth bit of the data is "0", the second non-volatile memory cell is programmed with the third threshold voltage level. When the third bit of the data is "0", the fourth bit of the data is "0", and the fifth bit of the data is "0", the first non-volatile memory cell is programmed with the third threshold voltage level.

Figure 5:
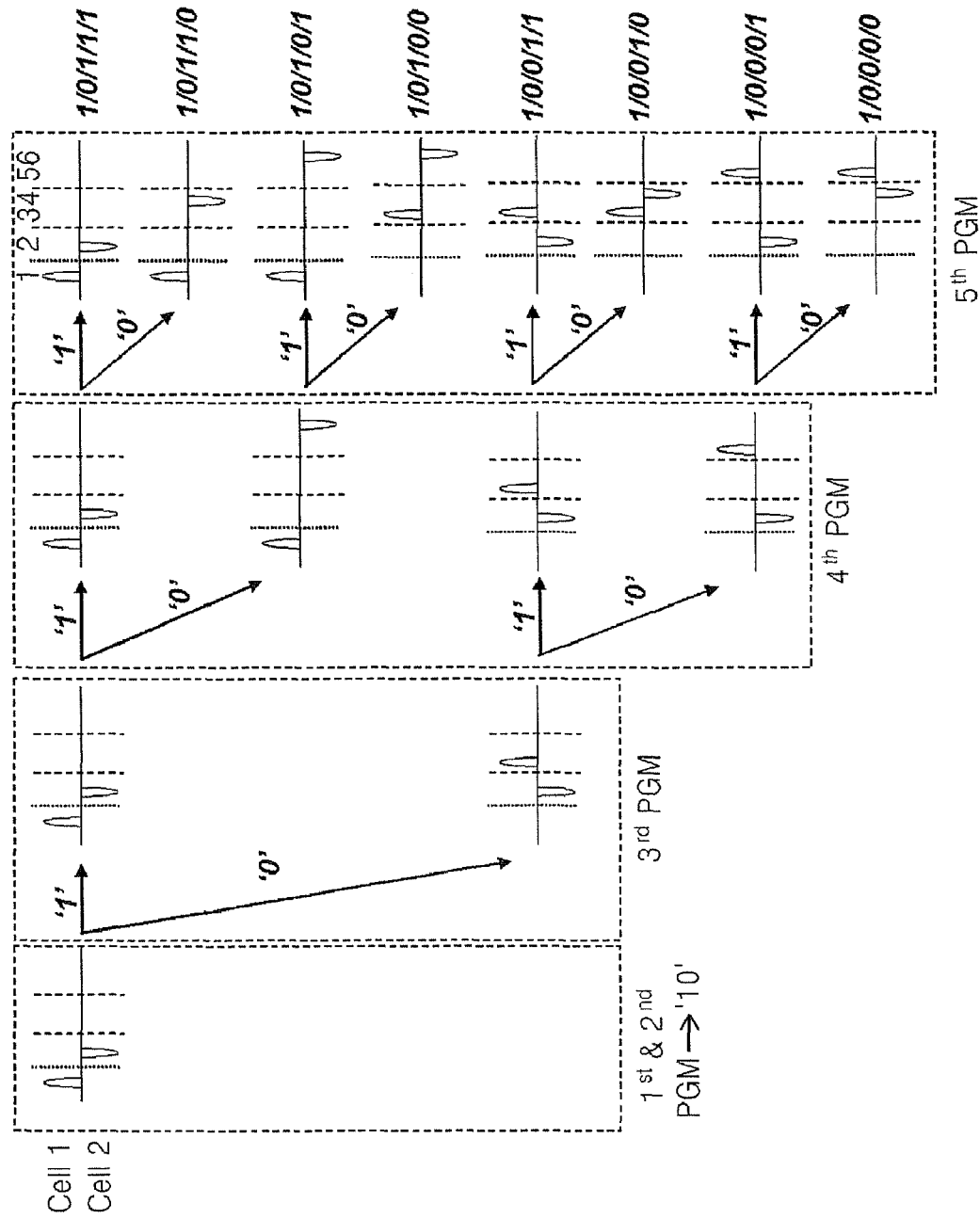
FIG. 5 shows diagrams for further illustrating the program operations according to embodiments illustrated in FIG. 2, when the first and second bits of data are "10"

FIG. 5 shows diagrams for further illustrating the programming 200 according to the embodiments illustrated in FIG. 2, when the first and second bits of the data are "10".

Figure 6:
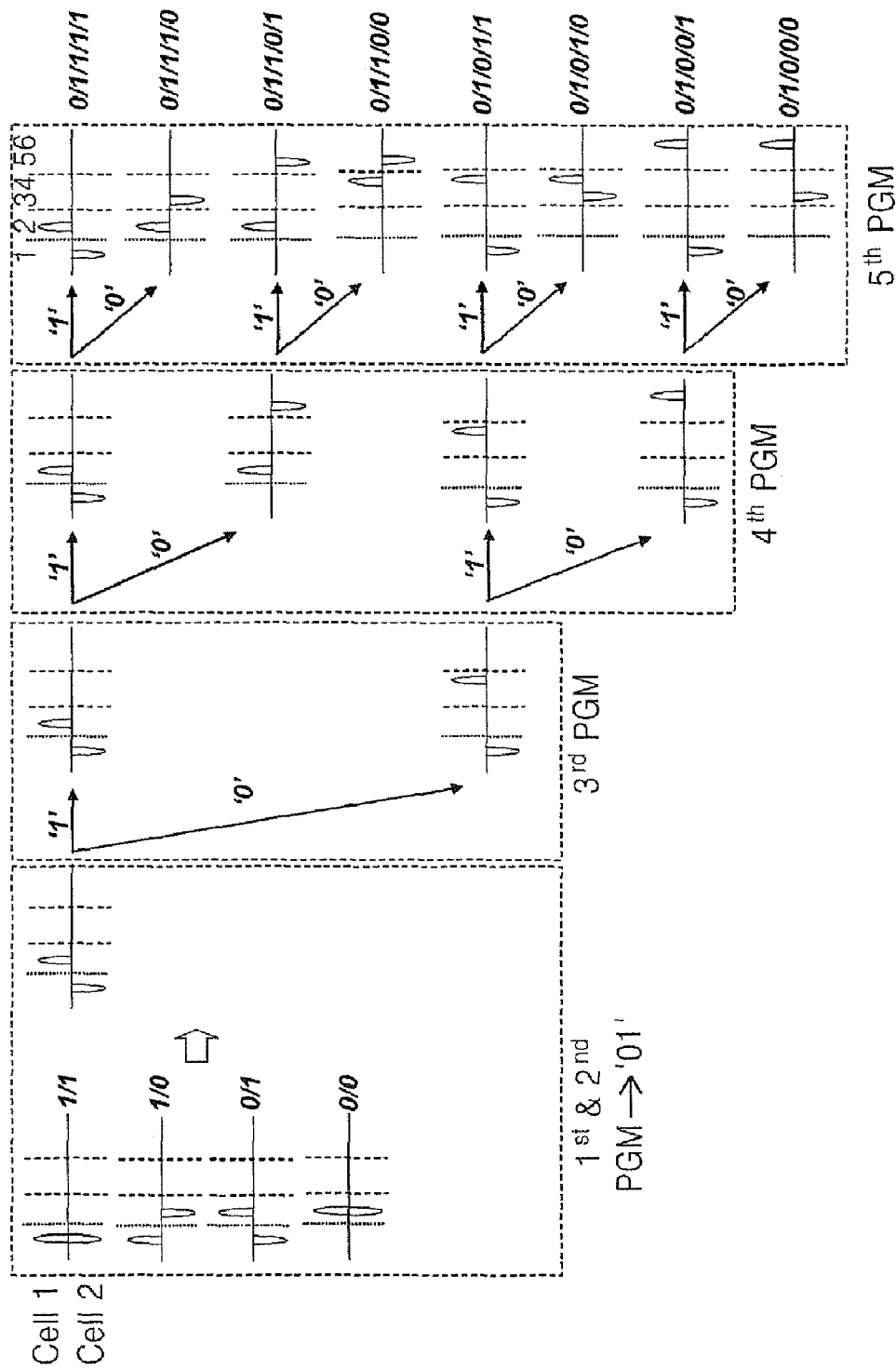
FIG. 6 shows diagrams for further illustrating program operations according to embodiments illustrated in FIG. 2, when the first and second bits of data are "01"

FIG. 6 shows diagrams for further illustrating the programming 200 according to the embodiments illustrated in FIG. 2, when the first and second bits of the data are "01".

Figure 7:
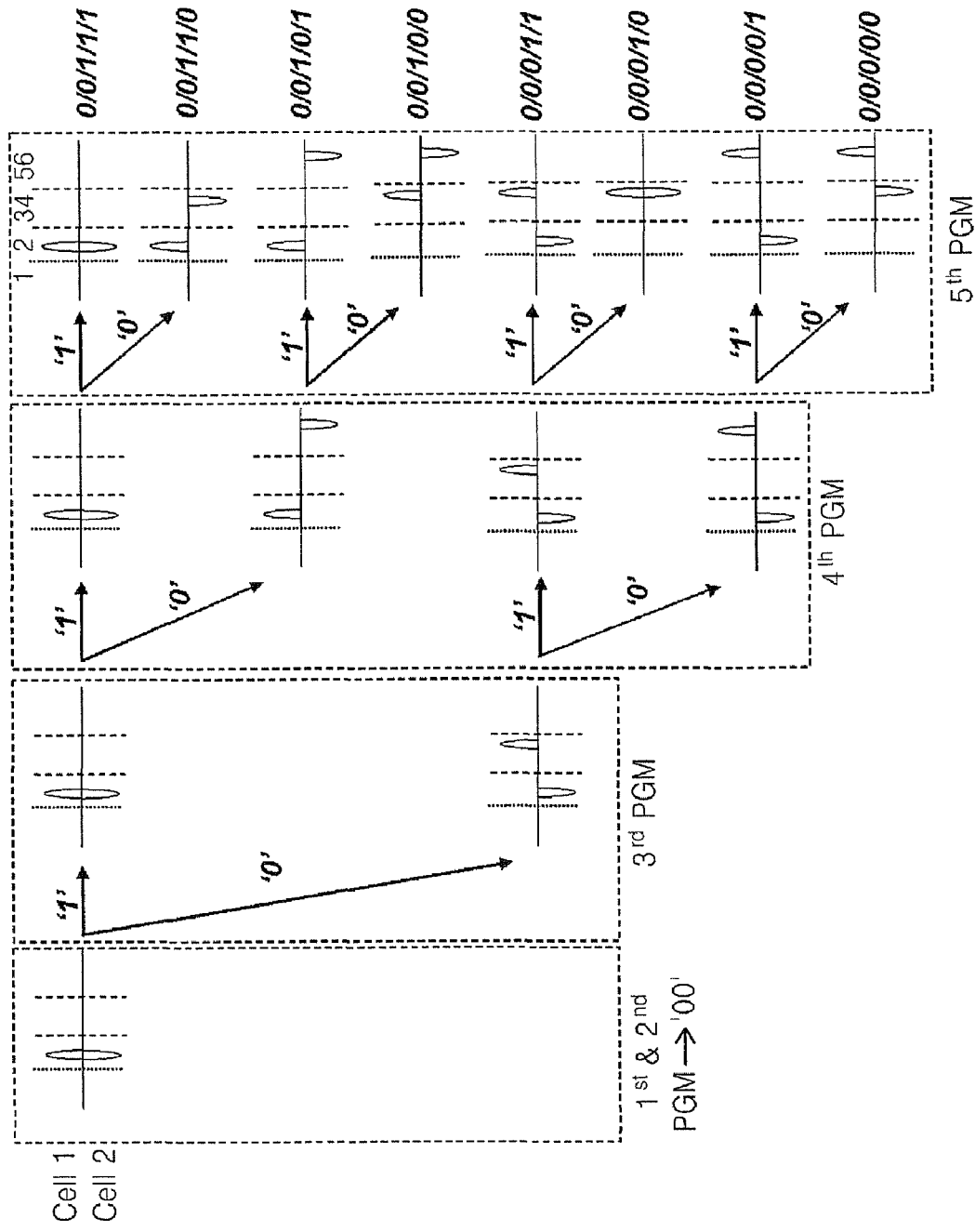
FIG. 7 shows diagrams for further illustrating program operations according to embodiments illustrated in FIG. 2, when the first and second bits of data are "00"

FIG. 7 shows diagrams for further illustrating the programming 200 according to the embodiments illustrated in FIG. 2, when the first and second bits of the data are "00".

The programming illustrated in FIGS. 5 through 7 correspond to the programming illustrated in FIG. 4, so that detailed descriptions thereof will be omitted.

Figure 8:
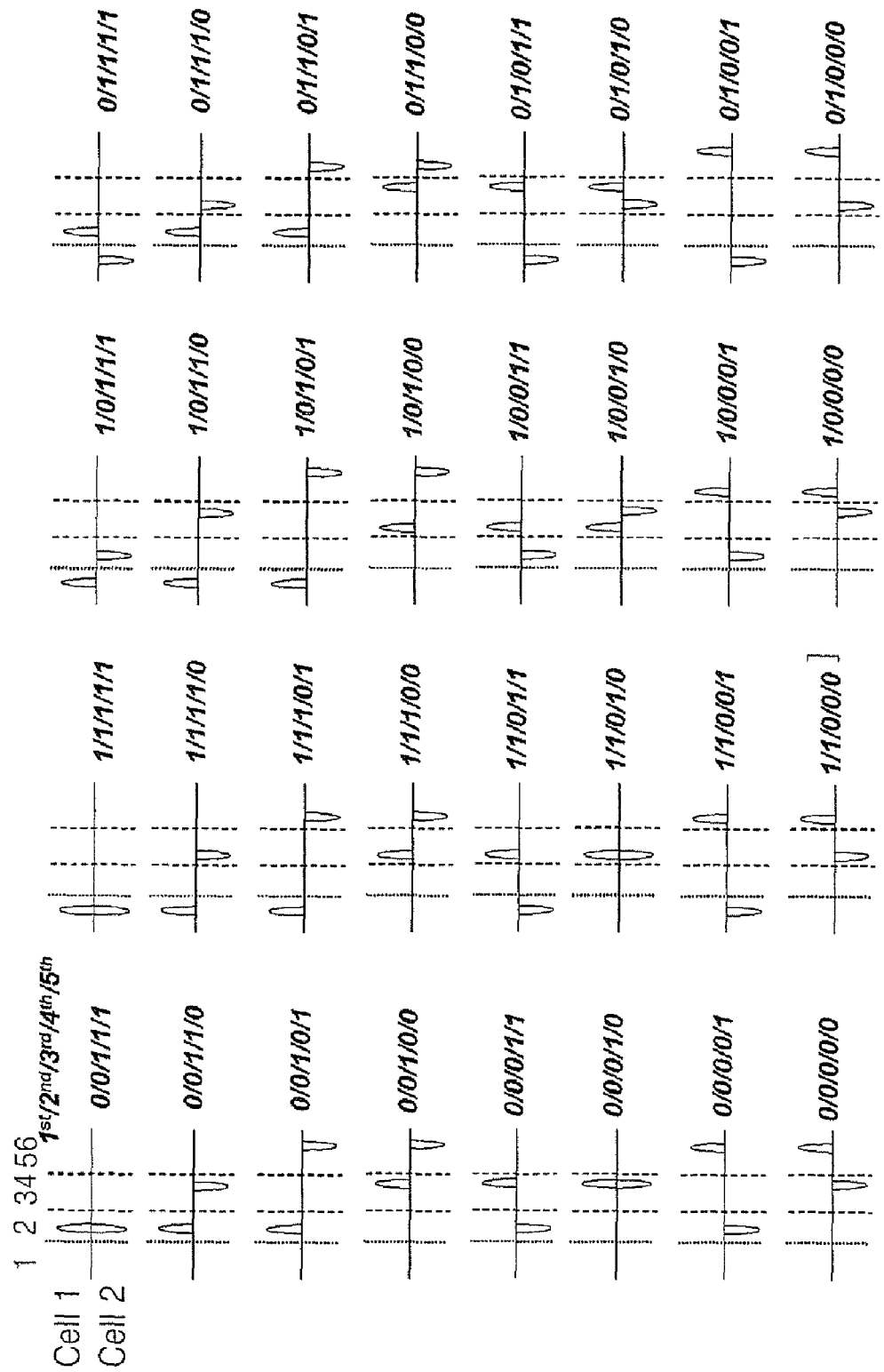
FIG. 8 illustrates non-volatile memory cells programmed according to embodiments illustrated in FIG. 2.

FIG. 8 illustrates non-volatile memory cells programmed with the programming operations 200 according to the embodiment illustrated in FIG. 2.

In FIG. 8, 5-bit data, namely, "00000" through "11111", are programmed in 2 non-volatile memory cells each having 6 threshold voltage levels.

Figure 9:
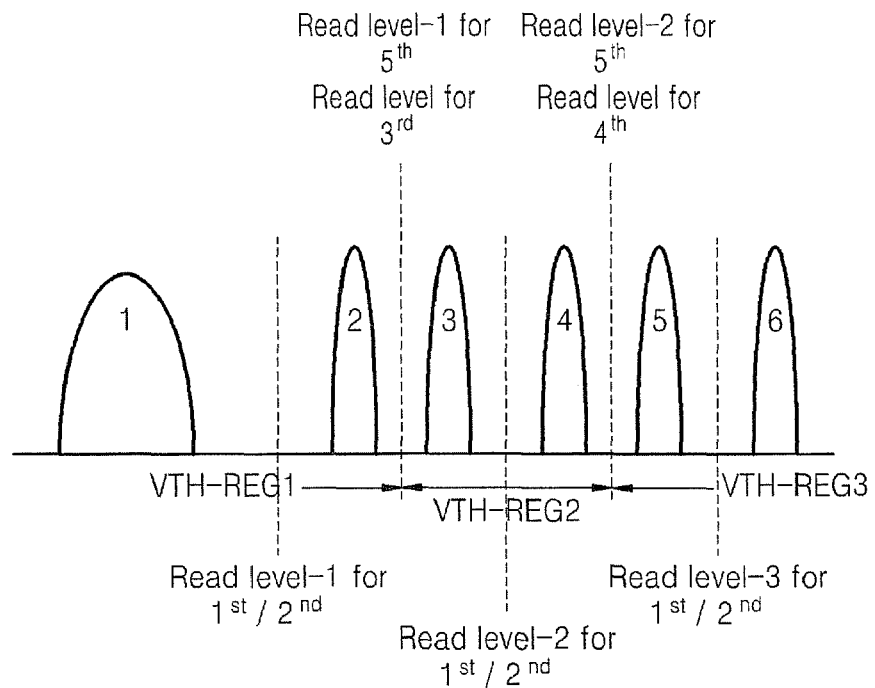
FIG. 9 illustrates a data read methods according to embodiments of the present invention.

FIG. 9 illustrates a data read according to embodiments of the present invention.

Referring to FIG. 9, the data read includes a first and second data bit read operation, a third data bit read operation, a fourth data bit read operation, and a fifth data bit read operation.

In the first and second data bit read operations, the first and second bits of the data are read using a first read threshold voltage between the first threshold voltage level and the second threshold voltage level, a third read threshold voltage between the third threshold voltage level and the fourth threshold voltage level, and a fifth read threshold voltage between the fifth threshold voltage level and the sixth threshold voltage level. In the third data bit read operation, the third bit of the data is read using a second read threshold voltage between the second threshold voltage level and the third threshold voltage level. In the fourth data bit read operation, the fourth bit of the data is read using a fourth read threshold voltage between the fourth threshold voltage level and the fifth threshold voltage level. In the fifth data bit read operation, the third bit of the data is read using the second read threshold voltage and the fourth read threshold voltage.

Programming according to the second embodiments includes a first program operation and a second program operation. In the first program operation the first through third bits of the data are programmed, and in the second program operation the fourth and fifth bits of the data are programmed.

Figure 10:
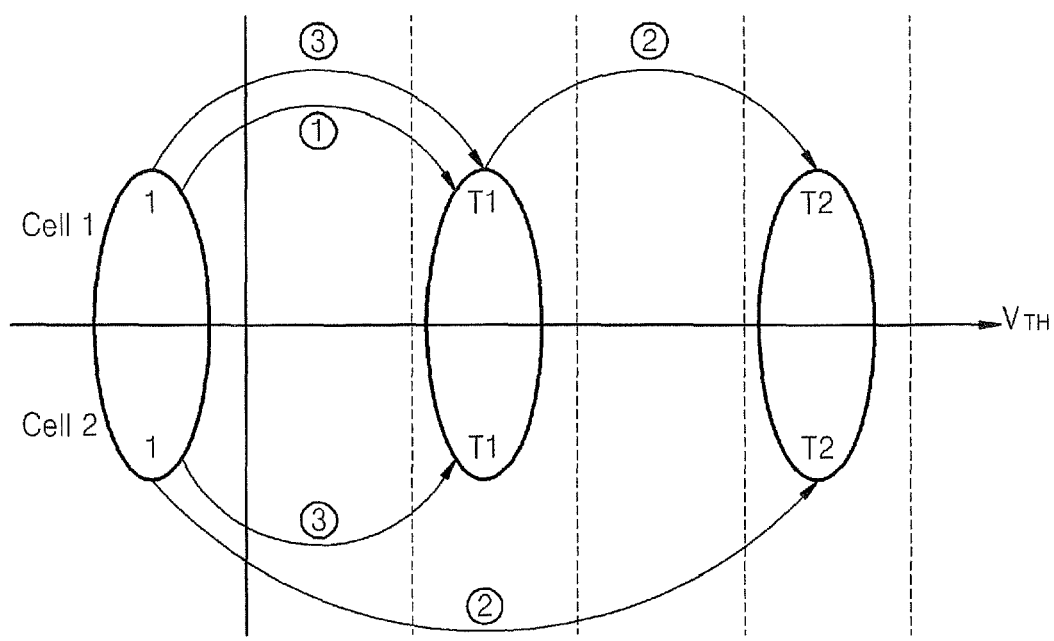
FIG. 10 illustrates programming operations according to second embodiments of the present invention.

FIG. 10 illustrates the first program operation according to second embodiments of the present invention.

Referring to FIG. 10, in the first program operation, the first through third bits of the data are programmed into the first non-volatile memory cell and the second non-volatile memory cell. In the first program operation, to store the first through third bits of the data, the first non-volatile memory cell and the second non-volatile memory cell are programmed with the first threshold voltage level (i.e., 1 shown in FIG. 10), or a first intermediate threshold voltage level (i.e., T1 shown in FIG. 10) higher than at least one of the threshold voltage levels of the first and second non-volatile memory cells, or a second intermediate threshold voltage level (i.e., T2 shown in FIG. 10) higher than the first intermediate threshold voltage level.

The distribution of each of the first and second intermediate threshold voltage levels may be wider than that of the at least one of the threshold voltage levels of the first and second non-volatile memory cells. Furthermore, in some embodiments, the distribution of each of the first and second intermediate threshold voltage levels may be wider than all of the threshold voltage levels of the first and second non-volatile memory cells.

The second intermediate threshold voltage level may be lower than at least one of the threshold voltage levels in other embodiments. The first intermediate threshold voltage level may be lower than the second intermediate threshold voltage level in other embodiments.

The first intermediate threshold voltage level may be higher than the second threshold voltage level and lower than the third threshold voltage level in other embodiments. The second intermediate threshold voltage level may be higher than the fourth threshold voltage level and lower than the fifth threshold voltage level in other embodiments.

Figure 11A:
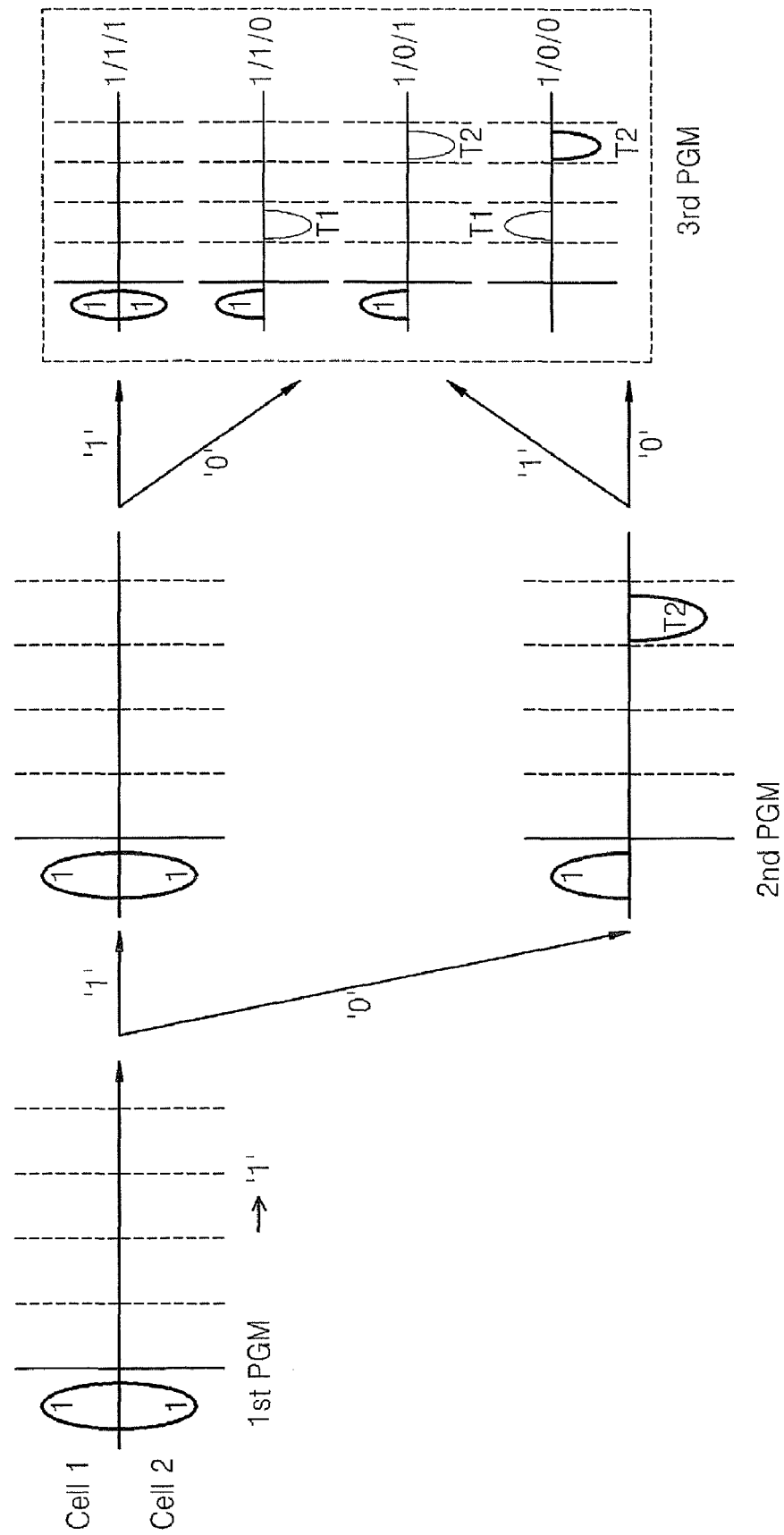
FIGS. 11A and 11B, which collectively form
Figure 11B:
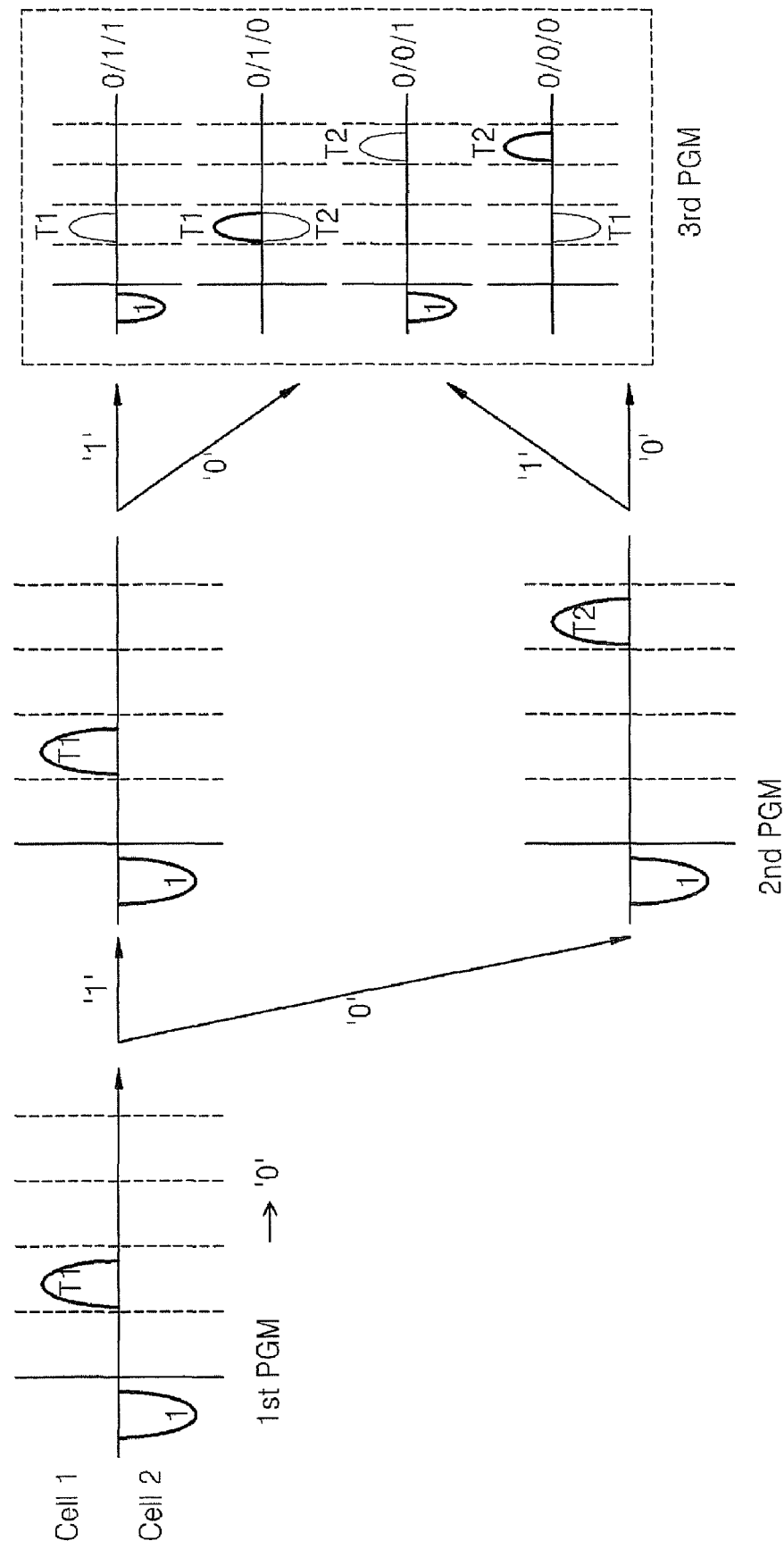

FIGS. 11A and 11B, which collectively form FIG. 11, illustrate the first program operation for programming the first through third bits of the data in the programming of FIG. 10. FIG. 11A illustrates the case in which a first data (a first bit) is "1", and FIG. 11B illustrates the case in which a first bit is "0". The first program operation will now be described in detail with reference to FIGS. 10 and 11.

The first program operation may include a first data bit program operation, a second data bit program operation, and a third data bit program operation.

In the first data bit program operation, to store the first data, the first non-volatile memory cell is programmed with the first threshold voltage level or the first intermediate threshold voltage level. For example, when the first data is "1", the first non-volatile memory cell may be programmed with the first threshold voltage level (1 of CELL1 shown in FIG. 11(a)). On the other hand, when the first data is "0", the first non-volatile memory cell may be programmed with the first intermediate threshold voltage level (T1 of CELL1 shown in FIG. 11(b)).

In the second data bit program operation, according to the threshold voltage level with which the first non-volatile memory cell has been programmed, the first non-volatile memory cell may be programmed with the first intermediate threshold voltage level or the second intermediate threshold voltage level, or the second non-volatile memory cell may be programmed with the first threshold voltage level or the second intermediate threshold voltage level.

More specifically, referring to FIG. 11A, when the threshold voltage level with which the first non-volatile memory cell has been programmed is the first threshold voltage level (1 of CELL1), to store the second data, the second non-volatile memory cell may be programmed with the first threshold voltage level (1 of CELL2) or the second intermediate threshold voltage level (T2 of CELL2). For example, when the second data is "0", the second non-volatile memory cell may be programmed with the second intermediate threshold voltage level (T2 of CELL2). That is, the threshold voltage of the second non-volatile memory cell is moved to the second intermediate threshold voltage level (T2 of CELL2) from the first threshold voltage level (1 of CELL2). On the other hand, when the second data is "1", the second non-volatile memory cell may be programmed with the first threshold voltage level (T1 of CELL2). That is, the threshold voltage of the second non-volatile memory cell is maintained as the first threshold voltage level (1 of CELL2).

Also, referring to FIG. 11B when the threshold voltage level with which the first non-volatile memory cell has been programmed is the first intermediate threshold voltage level (T1 of CELL1), to store the second data, the first non-volatile memory cell may be programmed with the first intermediate threshold voltage level (T1 of CELL1) or the second intermediate threshold voltage level (T2 of CELL2). For example, when the second data is "0", the first non-volatile memory cell may be programmed with the second intermediate threshold voltage level. That is, the threshold voltage of the first non-volatile memory cell is moved to the second intermediate threshold voltage level (T2 of CELL1) from the first intermediate threshold voltage level (T1 of CELL1). On the other hand, when the second data is "1", the first non-volatile memory cell may be programmed with the first intermediate threshold voltage level. That is, the threshold voltage of the first non-volatile memory cell is maintained as the first intermediate threshold voltage level (T1 of CELL1).

In the third data bit program operation, according to the threshold voltage level with which the second non-volatile memory cell has been programmed, the first non-volatile memory cell may be programmed with the first threshold voltage level or the first intermediate threshold voltage level, or the second non-volatile memory cell may be programmed with the first threshold voltage level or the first intermediate threshold voltage level.

More specifically, in the third data bit program operation, when the threshold voltage level with which the second non-volatile memory cell has been programmed in the second data bit program operation is the first threshold voltage level (1 of CELL2 shown in the FIG. 11A or FIG. 11B), the second non-volatile memory cell may be programmed with the first threshold voltage level (1 of CELL2 shown in the FIG. 11A or FIG. 11B) and the first intermediate threshold voltage level (T1 of CELL2 shown in the FIG. 11A or FIG. 11B) in order to store the third bit of the data. For example, when the third bit of the data is "0", the second non-volatile memory cell may be programmed with the first intermediate threshold voltage level (T1 of CELL2 shown in the FIG. 11A or FIG. 11B). On the other hand, when the third bit of the data is "1", the second non-volatile memory cell may be programmed with the first threshold voltage level (1 of CELL2 shown in the FIG. 11A or FIG. 11B).

When the threshold voltage level with which the second non-volatile memory cell has been programmed in the second data bit program operation is the second intermediate threshold voltage level (T2 of CELL2 shown in the FIG. 11A or FIG. 11B), the first non-volatile memory cell may be programmed with the first threshold voltage level (1 of CELL1 shown in the FIG. 11A or FIG. 11B) and the first intermediate threshold voltage level (T1 of CELL1 shown in the FIG. 11A or FIG. 11B) in order to store the third bit of the data. For example, when the third bit of the data is "0", the first non-volatile memory cell may be programmed with the first intermediate threshold voltage level (T1 of CELL1 shown in the FIG. 11A or FIG. 11B). On the other hand, when the third bit of the data is "1", the first non-volatile memory cell may be programmed with the first threshold voltage level (1 of CELL1 shown in the FIG. 11A or FIG. 11B).

Figure 12:
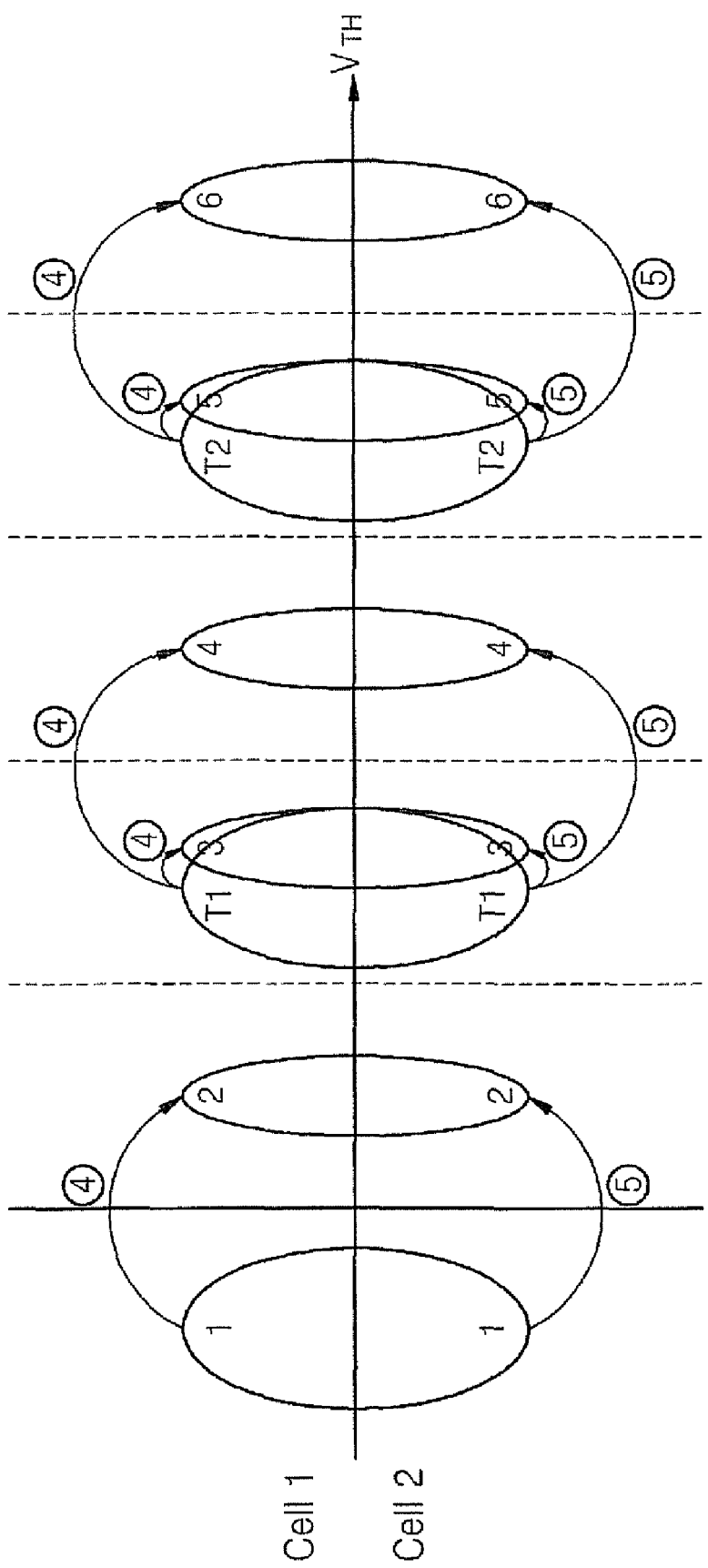
FIG. 12 illustrates a second program operation for programming fourth and fifth of the data in embodiments of FIG. 10.

FIG. 12 illustrates the second program operation of programming according to second embodiments of the present invention.

Referring to FIG. 12, in the second program operation, to store the fourth and fifth bits of the data, the first non-volatile memory cell or the second non-volatile memory cell is programmed with one of the first through sixth threshold voltage levels (1 to 6 of CELL1 or CELL2) according to a threshold voltage level with which previous data has been programmed.

In the first program operation illustrated in FIG. 10, in order to store the first through a fifth bit of the data in the first non-volatile memory cell or the second non-volatile memory cell, first, the first non-volatile memory cell or the second non-volatile memory cell is programmed with intermediate levels (for example, the first and second intermediate threshold voltage levels) in order to store the first through third bits of the data. Next, the first non-volatile memory cell or the second non-volatile memory cell is programmed with final levels (i.e., the first through sixth threshold voltage levels) in order to store the fourth and fifth bits of the data.

In the second program operation, to store the fourth data, the threshold voltage of the first non-volatile memory cell is changed and the threshold voltage of the second non-volatile memory cell is not changed. That is, the threshold voltage of the first non-volatile memory cell is moved to the first through sixth threshold voltage levels (1~6 of CELL1) from the first threshold voltage level (1 of CELL1), the first intermediate threshold voltage level (T1 of CELL1), and the second intermediate threshold voltage level (T2 of CELL1).

In the second program operation, to store the fifth data, the threshold voltage of the first non-volatile memory cell is not changed and the threshold voltage of the second non-volatile memory cell is changed. That is, the threshold voltage of the second non-volatile memory cell is moved to the first through sixth threshold voltage levels (1~6 of CELL2) from the first threshold voltage level (1 of CELL2), the first intermediate threshold voltage level (T1 of CELL2), and the second intermediate threshold voltage level (T2 of CELL2).

Figure 13:
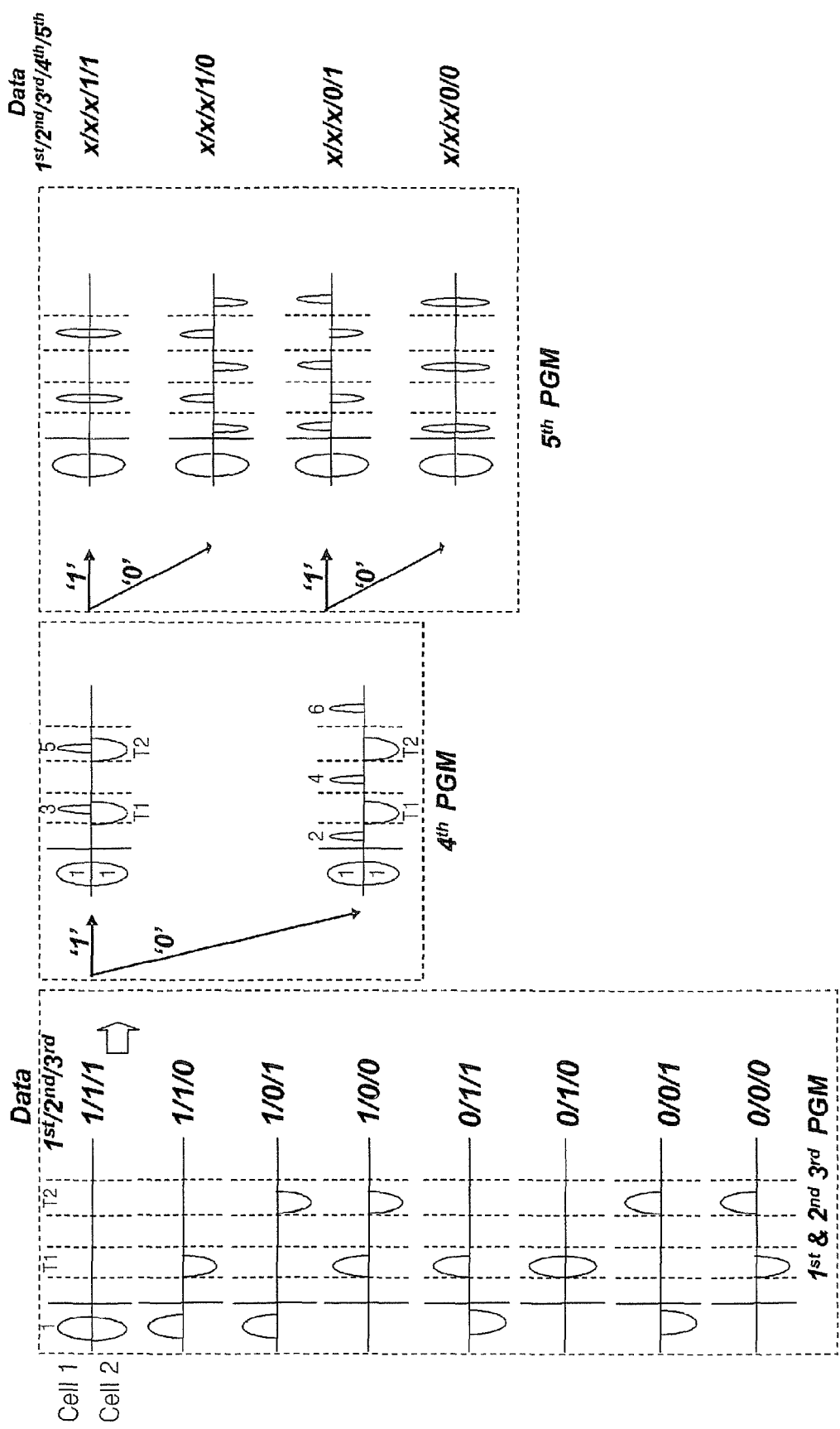
FIG. 13 illustrates a first program operation for programming first through third bits of data according to third embodiments of the present invention.

FIG. 13 illustrates the second program operation for programming the fourth and fifth bits of the data in the program method of FIG. 12.

In the second program operation, when the first non-volatile memory cell has been programmed with the first threshold voltage level (1 of CELL1) in the first program operation, the first non-volatile memory cell may be programmed with the first threshold voltage level (1 of CELL1) or the second threshold voltage level (2 of CELL1) in order to store the fourth bit of the data. For example, when the fourth bit of the data is "0", the first non-volatile memory cell may be programmed with the second threshold voltage level (2 of CELL1). On the other hand, when the fourth bit of the data is "1", the first non-volatile memory cell may be programmed with the first threshold voltage level (1 of CELL1).

In the second program operation, when the first non-volatile memory cell has been programmed with the first intermediate threshold voltage level (T1 of CELL1) in the first program operation, the first non-volatile memory cell may be programmed with the third threshold voltage level (3 of CELL1) or the fourth threshold voltage level (4 of CELL1) in order to store the fourth bit of the data. For example, when the fourth bit of the data is "0", the first non-volatile memory cell may be programmed with the fourth threshold voltage level (4 of CELL1). On the other hand, when the fourth bit of the data is "1", the first non-volatile memory cell may be programmed with the third threshold voltage level (3 of CELL1).

In the second program operation, when the first non-volatile memory cell has been programmed with the second intermediate threshold voltage level (T2 of CELL1) in the first program operation, the first non-volatile memory cell may be programmed with the fifth threshold voltage level (5 of CELL1) or the sixth threshold voltage level (6 of CELL1) in order to store the fourth bit of the data. For example, when the fourth bit of the data is "0", the first non-volatile memory cell may be programmed with the sixth threshold voltage level (6 of CELL1). On the other hand, when the fourth bit of the data is "1", the first non-volatile memory cell may be programmed with the fifth threshold voltage level (5 of CELL1).

In the second program operation, when the second non-volatile memory cell has been programmed with the first threshold voltage level (1 of CELL2) in the first program operation, the second non-volatile memory cell may be programmed with the first threshold voltage level (1 of CELL2) or the second threshold voltage level (2 of CELL2) in order to store the fifth bit of the data. For example, when the fifth bit of the data is "0", the second non-volatile memory cell may be programmed with the second threshold voltage level (2 of CELL2). On the other hand, when the fifth bit of the data is "1", the second non-volatile memory cell may be programmed with the first threshold voltage level (1 of CELL2).

In the second program operation, when the second non-volatile memory cell has been programmed with the first intermediate threshold voltage level (T1 of CELL2) in the first program operation, the second non-volatile memory cell may be programmed with the third threshold voltage level (3 of CELL2) or the fourth threshold voltage level (4 of CELL2) in order to store the fifth bit of the data. For example, when the fifth bit of the data is "0", the second non-volatile memory cell may be programmed with the fourth threshold voltage level (4 of CELL2). On the other hand, when the fifth bit of the data is "1", the second non-volatile memory cell may be programmed with the third threshold voltage level (3 of CELL2).

In the second program operation, when the second non-volatile memory cell has been programmed with the second intermediate threshold voltage level (T2 of CELL2) in the first program operation, the first non-volatile memory cell may be programmed with the fifth threshold voltage level (5 of CELL2) or the sixth threshold voltage level (6 of CELL2) in order to store the fifth bit of the data. For example, when the fifth bit of the data is "0", the second non-volatile memory cell may be programmed with the sixth threshold voltage level (6 of CELL2). On the other hand, when the fifth bit of the data is "1", the second non-volatile memory cell may be programmed with the fifth threshold voltage level (5 of CELL2).

After the first program operation, the first and second non-volatile memory cells have one of the first threshold voltage level (1 of CELL1 or CELL2), the first intermediate threshold voltage level (T1 of CELL1 or CELL2), and the second intermediate threshold voltage level (T2 of CELL1 or CELL2), respectively. After the fourth data bit programming of the second program operation, the first non-volatile memory cells has one of the first through the sixth threshold voltage level (1~6 of CELL1). After the fifth data bit programming of the second program operation, the second nonvolatile memory cells has one of the first through the sixth threshold voltage level (1~6 of CELL2).

Programming according to third embodiments of the present invention includes a first program operation in which the first through third bits are programmed and a second program operation in which the fourth and fifth bits are programmed.

Figure 14:
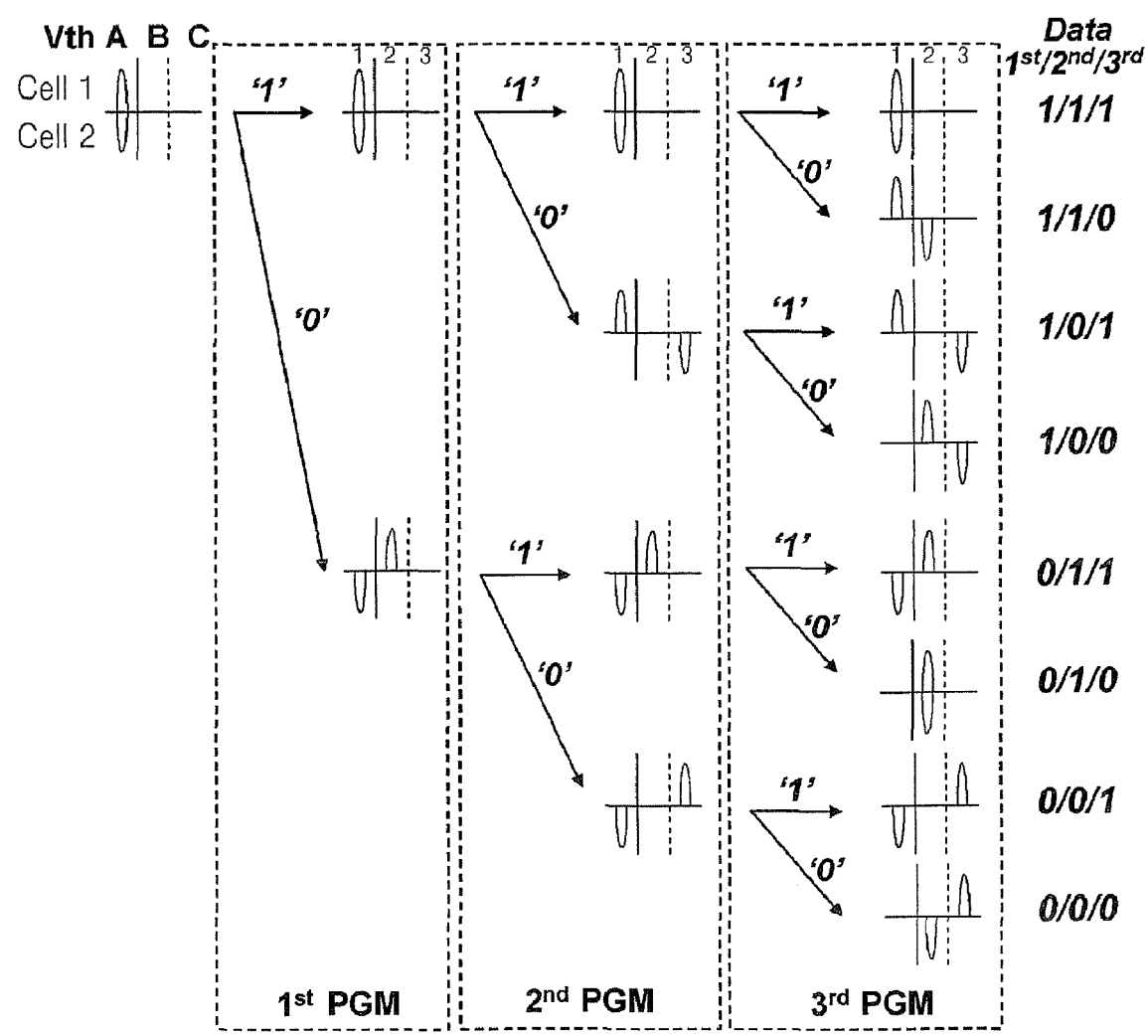
FIG. 14 illustrates a second program operation for programming fourth and fifth bits of the data according to the third embodiments.

FIG. 14 illustrates the first program operation for programming the first through third bits of the data according to the third embodiment of the present invention.

Referring to FIG. 14, in the first program operation, to store the first through third bits of the data, the first and second non-volatile memory cells are programmed with one of the first through third threshold voltage levels (1~3 of CELL1 and CELL2).

The first program operation includes a first data bit program operation, a second data bit program operation, and a third bit program operation.

In the first data bit program operation, to store the first bit of the data, the first non-volatile memory cell is programmed with the first threshold voltage level (1 of CELL1) or the first intermediate threshold voltage level (T1 of CELL1). In the second data bit program operation, to store the second bit of the data, the first non-volatile memory cell is programmed with the second threshold voltage level (2 of CELL1) or the third threshold voltage level (3 of CELL1) or the second non-volatile memory cell is programmed with the first threshold voltage level (T1 of CELL2) or the third threshold voltage level (3 of CELL2), according to the threshold voltage level with which the first non-volatile memory cell has been programmed.

In the second data bit program operation, when the threshold voltage level with which the first non-volatile memory cell has been programmed in the first data bit program operation is the first threshold voltage level (1 of CELL1), the second non-volatile memory cell is programmed with the first threshold voltage level (1 of CELL2) or the third threshold voltage level (3 of CELL2) in order to store the second data. When the threshold voltage level with which the first non-volatile memory cell has been programmed in the first data bit program operation is the second threshold voltage level (2 of CELL1), the first non-volatile memory cell is programmed with the second threshold voltage level (2 of CELL1) or the third threshold voltage level (3 of CELL1) in order to store the second data.

In the third data bit program operation, according to the threshold voltage level with which the second non-volatile memory cell has been programmed, either the first non-volatile memory cell or the second non-volatile memory cell is programmed with the first threshold voltage level (1 of CELL1 or CELL2) or the second threshold voltage level (2 of CELL1 or CELL2) in order to store the third bit of the data.

In the third data bit program operation, when the threshold voltage level with which the second non-volatile memory cell has been programmed in the second data bit program operation is the first threshold voltage level (1 of CELL2), the second non-volatile memory cell is programmed with the first threshold voltage level (1 of CELL2) or the second threshold voltage level (2 of CELL2) in order to store the third bit of the data. When the threshold voltage level with which the second non-volatile memory cell has been programmed in the second data bit program operation is the third threshold voltage level (3 of CELL2), the first non-volatile memory cell is programmed with the first threshold voltage level (1 of CELL1) or the second threshold voltage level (2 of CELL1) in order to store the third bit of the data.

Figure 15:
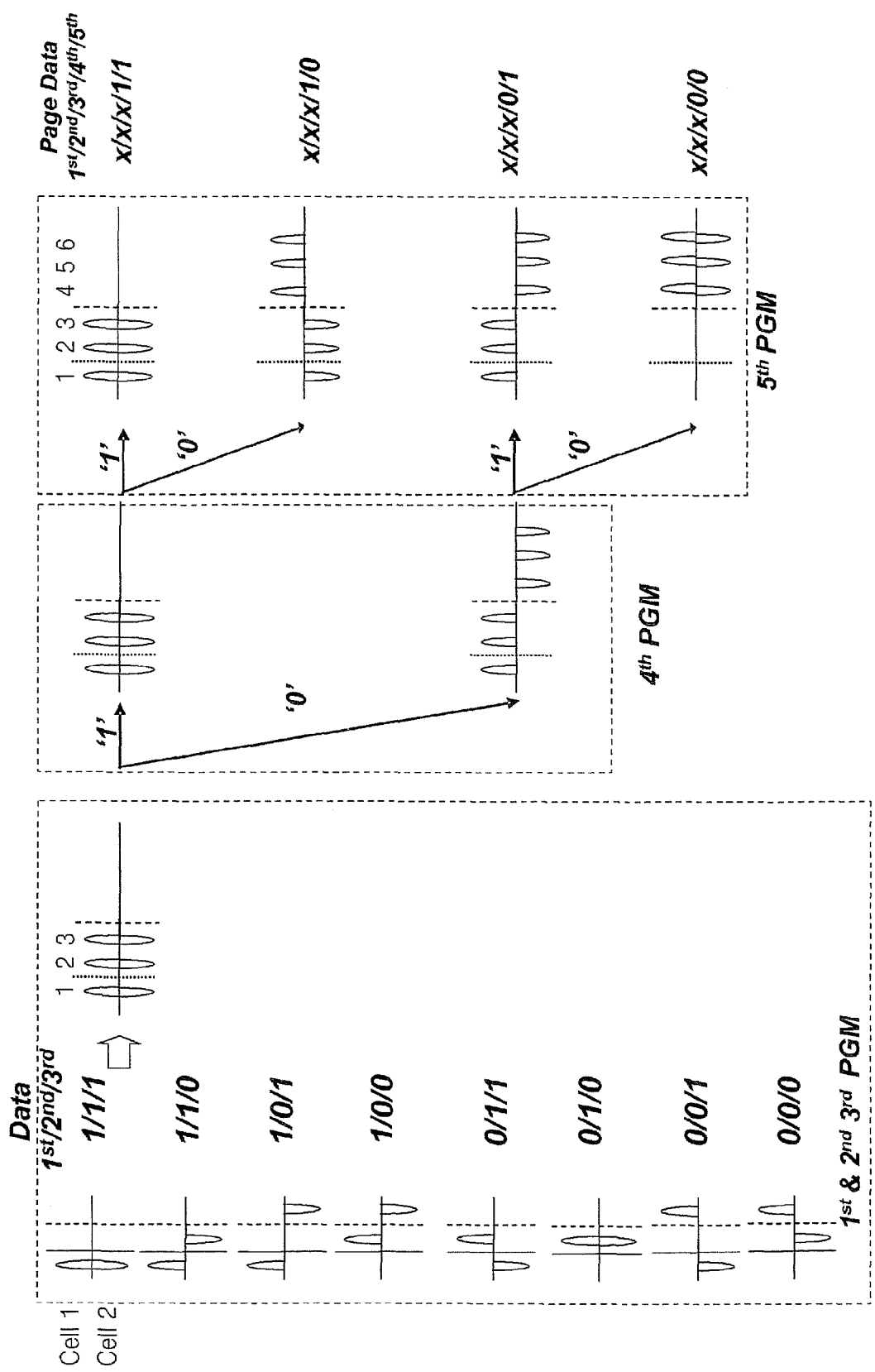
FIG. 15 illustrates the second program operation for programming the fourth and fifth bits of the data according to the third embodiments.

FIG. 15 illustrates the second program operation for programming the fourth and fifth bits of the data in the program method according to the third embodiments.

Referring to FIG. 15, in the second program operation, to store the fourth and fifth bits of the data, either the first non-volatile memory cell or the second non-volatile memory cell is programmed with one of the fourth through sixth threshold voltage levels (4~6 of CELL1 or CELL2) according to a threshold voltage level with which the previous bits of the data have been programmed.

In the second program operation, when the second non-volatile memory cell has been programmed with the first threshold voltage level (1 of CELL2) in the first program operation, the second non-volatile memory cell is programmed with the first threshold voltage level (1 of CELL2) or the fourth threshold voltage level (4 of CELL2) in order to store the fourth bit of the data. When the second non-volatile memory cell has been programmed with the second threshold voltage level (2 of CELL2) in the first program operation, the second non-volatile memory cell is programmed with the second threshold voltage level (2 of CELL2) or the fifth threshold voltage level (5 of CELL2) in order to store the fourth bit of the data. When the second non-volatile memory cell has been programmed with the third threshold voltage level (3 of CELL2) in the first program operation, the second non-volatile memory cell is programmed with the third threshold voltage level (3 of CELL2) or the sixth threshold voltage level (6 of CELL2) in order to store the fourth bit of the data.

In the second program operation, when the first non-volatile memory cell has been programmed with the first threshold voltage level in the first program operation, the first non-volatile memory cell is programmed with the first threshold voltage level (1 of CELL1) or the fourth threshold voltage level (4 of CELL1) in order to store the fifth bit of the data. When the first non-volatile memory cell has been programmed with the second threshold voltage level (2 of CELL1) in the first program operation, the first non-volatile memory cell is programmed with the second threshold voltage level (2 of CELL1) or the fifth threshold voltage level (5 of CELL1) in order to store the fifth bit of the data. When the first non-volatile memory cell has been programmed with the third threshold voltage level (3 of CELL1) in the first program operation, the first non-volatile memory cell is programmed with the third threshold voltage level (3 of CELL1) or the sixth threshold voltage level (6 of CELL1) in order to store the fifth bit of the data.

Each of the non-volatile memory devices illustrated in FIGS. 1A and 1B includes at least one non-volatile memory cell pair including a first non-volatile memory cell and a second non-volatile memory cell. Each of the first non-volatile memory cell and the second non-volatile memory cell may be programmed with a plurality of threshold voltage levels that sequentially increase. The logic level of the non-volatile memory cell pair depends on a combination of a threshold voltage level with which the first non-volatile memory cell has been programmed and a threshold voltage level programmed in the second non-volatile memory cell.

Each of the first non-volatile memory cell and the second non-volatile memory cell may be programmed with the first through sixth threshold voltage levels that sequentially increase. In this case, each non-volatile memory cell pair may store 5-bit data.

Furthermore, each of the first non-volatile memory cell and the second non-volatile memory cell may be programmed with the first through third threshold voltage levels that sequentially increase. Also, each of the first non-volatile memory cell and the second non-volatile memory cell may be programmed with first through twelfth threshold voltage levels that sequentially increase.

Accordingly, methods and controllers (circuits) for programming non-volatile memory devices have been described. The non-volatile memory devices include a first non-volatile memory cell and a second non-volatile memory cell, each of which can be programmed with first through sixth threshold voltage levels that sequentially increase. The methods comprise programming five bits of data in the first and second non-volatile memory cells by programming an initial subset of at least two of the five bits of data into the first and second non-volatile memory cells and programming a remaining subset of the five bits of data into the first and second non-volatile memory cells according to threshold voltage levels at which the initial subset of at least two of the five bits have been programmed into the first and second non-volatile memory cells. A controller may be configured to perform this programming.

As described above, in a non-volatile memory device, a method of programming the non-volatile memory device, and a method of reading data from the non-volatile memory device according to the present invention, program and data read are performed using 6 threshold voltage levels, so that 5-bit data can be stored and read out. Therefore, the non-volatile memory device has high integration as compared to when 4 threshold voltage levels are used, and is reliable as compared to when 8 threshold voltage levels are used.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of programming a non-volatile memory device comprising a first non-volatile memory cell and a second non-volatile memory cell, each of which can be programmed with first through sixth threshold voltage levels that sequentially increase, the method comprising:

programming five bits of data in the first and second non-volatile memory cells by programming an initial subset of two of the five bits of data into the first and second non-volatile memory cells, respectively, and then programming a remaining subset of three of the five bits of data into the first and second non-volatile memory cells according to threshold voltage levels at which the initial subset of the two of the five bits have been programmed into the first and second non-volatile memory cells, wherein programming the remaining subset of three of the five bits of data comprises determining whether to program the remaining subset into the first non-volatile memory cell or the second non-volatile memory cell and whether to program the remaining subset with which one of the third through sixth threshold voltages, according to threshold voltage levels at which the initial subset of two of the five bits have been programmed into the first and second non-volatile memory cells.

2. A method according to claim 1 wherein programming five bits of data comprises:

programming the first and second non-volatile memory cells with one of the first threshold voltage level or the second threshold voltage level in order to store first and second bits of data, in a first program operation; and programming one of the first or second non-volatile memory cells with one of the third through sixth threshold voltage levels in order to store third through fifth bits of the data according to a threshold voltage level with which the first and second bits of the data have been programmed, in a second program operation.

3. A method according to claim 1 wherein programming five bits of data comprises:

programming the first non-volatile memory cell and the second non-volatile memory cell with one of the first threshold voltage level or the second threshold voltage level in order to store first and second bits of data, in a first and second data bit program operation;

programming the first non-volatile memory cell with one of the third threshold voltage level or the fourth threshold voltage level according to the first and second bits of the data in order to store a third bit of the data, in a third data bit program operation;

programming one of the first non-volatile memory cell or the second non-volatile memory cell with one of the fifth threshold voltage level or the sixth threshold voltage level according to the third bit of the data in order to store a fourth bit of the data, in a fourth data bit program operation; and programming one of the first non-volatile memory cell or the second non-volatile memory cell with one of the third threshold voltage level or the fourth threshold voltage level according to the fourth bit of the data in order to store a fifth bit of the data, in a fifth data bit program operation.

4. The method of claim 3, wherein:

in the third data bit program operation, according to the threshold voltage level with which the first non-volatile memory cell has been programmed, the first non-volatile memory cell is programmed with one of the third threshold voltage level or the fourth threshold voltage level in order to store the third bit of the data;

in the fourth data bit program operation, according to the threshold voltage level with which the first non-volatile memory cell has been programmed, one of the first non-volatile memory cell or the second non-volatile memory cell is programmed with one of the fifth threshold voltage level or the sixth threshold voltage level in order to store the fourth bit of the data; and in the fifth data bit program operation, according to the threshold voltage level with which the second non-volatile memory cell has been programmed, one of the first non-volatile memory cell or the second non-volatile memory cell is programmed with one of the third threshold voltage level or the fourth threshold voltage level in order to store the fifth bit of the data.

5. The method of claim 2, wherein:

in the third data bit program operation, the first non-volatile memory cell is programmed with one of a combination of the first and third threshold voltage levels or a combination of the second and fourth threshold voltage levels in order to store the third bit of the data;

in the fourth data bit program operation, in order to store the fourth bit of the data, the first non-volatile memory cell is programmed with one of a combination of the third and fifth threshold voltage levels or a combination of the fourth and sixth threshold voltage levels or the second non-volatile memory cell is programmed with one of a combination of the first and fifth threshold voltage levels or a combination of the second and sixth threshold voltage levels; and in the fifth data bit program operation, in order to store the fifth bit of the data, the first non-volatile memory cell is programmed with one of a combination of the first and third threshold voltage levels or a combination of the second and fourth threshold voltage levels or the second non-volatile memory cell is programmed with one of a combination of the first and third threshold voltage levels or a combination of the second and fourth threshold voltage levels.

6. A method according to claim 1 wherein programming five bits of data comprises:
programming the first and second non-volatile memory cells with one of the first threshold voltage level, a first intermediate threshold voltage level higher than at least one of the first through sixth threshold voltage levels, or a second intermediate threshold voltage level higher than the first intermediate threshold voltage level in order to store first through third bits of data, in a first program operation; and
programming one of the first or second non-volatile memory cells with one of the first through sixth threshold voltage levels in order to store fourth through fifth bits of the data according to a threshold voltage level with which the first through third bits of the data have been programmed, in a second program operation.

7. The method of claim 6, wherein distributions of the first and second intermediate threshold voltage levels are wider than a distribution of at least one of the second through sixth threshold voltage levels.

8. The method of claim 7, wherein distributions of the first and second intermediate threshold voltage levels are wider than all distributions of the second through sixth threshold voltage levels.

9. The method of claim 6, wherein:
the second intermediate threshold voltage level is lower than at least one of the first through sixth threshold voltage levels; and
the first intermediate threshold voltage level is lower than the second intermediate threshold voltage level.

10. The method of claim 6, wherein:
the first intermediate threshold voltage level is higher than the second threshold voltage level and lower than the third threshold voltage level; and
the second intermediate threshold voltage level is higher than the fourth threshold voltage level and lower than the fifth threshold voltage level.

11. The method of claim 6, wherein:
in the second program operation,
when one of the first non-volatile memory cell or the second non-volatile memory cell has been programmed with the first threshold voltage level in the first program operation, one of the first non-volatile memory cell or the second non-volatile memory cell is programmed with one of the first threshold voltage level or the second threshold voltage level in order to store one of the fourth and fifth bits of the data;
when one of the first non-volatile memory cell or the second non-volatile memory cell has been programmed with the first intermediate threshold voltage level in the first program operation, one of the first non-volatile memory cell or the second non-volatile memory cell is programmed with one of the third threshold voltage level or the fourth threshold voltage level in order to store one of the fourth and fifth bits of the data; and
when one of the first non-volatile memory cell or the second non-volatile memory cell has been programmed with the second intermediate threshold voltage level in the first program operation, one of the first non-volatile memory cell or the second non-volatile memory cell is programmed with one of the fifth threshold voltage level or the sixth threshold voltage level in order to store one of the fourth and fifth bits of the data.

12. The method of claim 6, wherein the first program operation comprises:
programming the first non-volatile memory cell with one of the first threshold voltage level or the first intermediate threshold voltage level in order to store the first bit of the data, in a first data bit program operation;
programming the first non-volatile memory cell with one of the first intermediate threshold voltage level or the second intermediate threshold voltage level or programming the second non-volatile memory cell with one of the first threshold voltage level or the second intermediate threshold voltage level according to a threshold voltage level with which the first non-volatile memory cell has been programmed, in order to store the second bit of the data, in a second data bit program operation; and
programming either the first non-volatile memory cell or the second non-volatile memory cell with one of the first threshold voltage level or the first intermediate threshold voltage level according to a threshold voltage level with which the second non-volatile memory cell has been programmed, in order to store the third bit of the data, in a third data bit program operation.

13. A method according to claim 1 wherein programming five bits of data comprises:
programming the first and second non-volatile memory cells with one of the first threshold voltage level, the second threshold voltage level, or the third threshold voltage level in order to store first through third bits of data, in a first program operation; and
programming one of the first and second non-volatile memory cells with one of the fourth threshold voltage level, the fifth threshold voltage level, or the sixth threshold voltage level in order to store third through fifth bits of the data according to a threshold voltage level with which the first through third bits of the data have been programmed, in a second program operation.

14. The method of claim 13, wherein:
in the second program operation,
when one of the first non-volatile memory cell or the second non-volatile memory cell has been programmed with the first threshold voltage level in the first program operation, one of the first non-volatile memory cell or the second non-volatile memory cell is programmed with one of the first threshold voltage level or the fourth threshold voltage level in order to store one of the fourth or fifth bits of the data;
when one of the first non-volatile memory cell or the second non-volatile memory cell has been programmed with the second threshold voltage level in the first program operation, one of the first non-volatile memory cell or the second non-volatile memory cell is programmed with one of the second threshold voltage level or the fifth threshold voltage level in order to store one of the fourth or fifth bits of the data; and
when one of the first non-volatile memory cell or the second non-volatile memory cell has been programmed with the third threshold voltage level in the first program operation, one of the first non-volatile memory cell or the second non-volatile memory cell is programmed with one of the third threshold voltage level or the sixth threshold voltage level in order to store one of the fourth or fifth bits of the data.

15. A method of reading data from a non-volatile memory device comprising a first non-volatile memory cell and a second non-volatile memory cell, each of which can be programmed with first through sixth threshold voltage levels that sequentially increase, the method comprising:

reading first and second bits of data by using a first read threshold voltage between the first threshold voltage level and the second threshold voltage level, a third read threshold voltage between the third threshold voltage level and the fourth threshold voltage level, and a fifth read threshold voltage between the fifth threshold voltage level and the sixth threshold voltage level, in a first and second data bit read operation;

reading a third bit of the data by using a second read threshold voltage between the second threshold voltage level and the third threshold voltage level, in a third data bit read operation;

reading a fourth bit of the data by using a fourth read threshold voltage between the fourth threshold voltage level and the fifth threshold voltage level, in a fourth data bit read operation; and reading a fifth bit of the data by using the second read threshold voltage and the fourth read threshold voltage, in a fifth data bit read operation;

wherein the non-volatile memory device is programmed by the method of claim 1.

16. A non-volatile memory device comprising:

a first non-volatile memory cell which is capable of being programmed with first through sixth threshold voltage levels that sequentially increase;

a second non-volatile memory cell which is also capable of being programmed with the first through sixth threshold voltage levels; and a controller that is configured to program five bits of data in the first and second nonvolatile memory cells by programming an initial subset of two of the five bits of data into the first and second non-volatile memory cells, respectively, and then programming a remaining subset of three of the five bits of data into the first and second non-volatile memory cells according to threshold voltage levels at which the initial subset of the two of the five bits have been programmed into the first and second non-volatile memory cells, wherein programming the remaining subset of three of the five bits of data comprises determining whether to program the remaining subset into the first non-volatile memory cell or the second non-volatile memory cell and whether to program the remaining subset with which one of the third through sixth threshold voltages, according to threshold voltage levels at which the initial subset of two of the five bits have been programmed into the first and second non-volatile memory cells.

17. The non-volatile memory device of claim 16 wherein the controller is configured to program five bits of data by programming the first non-volatile memory cell and the second non-volatile memory cell with one of the first threshold voltage level or the second threshold voltage level in order to store the first and second bits of the data, programming the first non-volatile memory cell with one of the third threshold voltage level or the fourth threshold voltage level according to the first and second bits of the data in order to store the third bit of the data, programming one of the first non-volatile memory cell or the second non-volatile memory cell with one of the fifth threshold voltage level or the sixth threshold voltage level according to the third bit of the data in order to store the fourth bit of the data, and programming one of the first non-volatile memory cell or the second non-volatile memory cell with one of the third threshold voltage level or the fourth threshold voltage level according to the fourth bit of the data in order to store the fifth bit of the data.

18. The non-volatile memory device of claim 17, wherein the first non-volatile memory cell and the second non-volatile memory cell are connected to a given wordline.

19. The non-volatile memory device of claim 17, wherein the first non-volatile memory cell and the second non-volatile memory cell are connected to a given bitline.

20. The non-volatile memory device of claim 17, wherein the controller is further configured to read the first through fifth bits of the data from the first and second non-volatile memory cells by reading out the first and second bits of the data using a first read threshold voltage between the first threshold voltage level and the second threshold voltage level, a third read threshold voltage between the third threshold voltage level and the fourth threshold voltage level, and a fifth read threshold voltage between the fifth threshold voltage level and the sixth threshold voltage level, by reading out the third bit of the data using a second read threshold voltage between the second threshold voltage level and the third threshold voltage level, by reading out the fourth bit of the data using a fourth read threshold voltage between the fourth threshold voltage level and the fifth threshold voltage level, and by reading out the third bit of the data using the second read threshold voltage and the fourth read threshold voltage.

21. A non-volatile memory device comprising:

at least one non-volatile memory cell pair comprising a first non-volatile memory cell and a second non-volatile memory cell, each of which can be programmed with a plurality of threshold voltage levels that sequentially increase;

wherein a logic level of data of the non-volatile memory cell pair depends on a combination of a threshold voltage level with which the first non-volatile memory cell has been programmed and a threshold voltage level with which the second non-volatile memory cell has been programmed, wherein five bits of data have been programmed in the first and second nonvolatile memory cells by programming an initial subset of two of the five bits of data into the first and second non-volatile memory cells, respectively, and then programming a remaining subset of three of the five bits of data into the first and second non-volatile memory cells according to threshold voltage levels at which the initial subset of the two of the five bits have been programmed into the first and second non-volatile memory cells, and wherein programming the remaining subset of the five bits of data determining whether to program the remaining subset into the first non-volatile memory cell or the second non-volatile memory cell and whether to program the remaining subset with which one of the third through sixth threshold voltages, according to threshold voltage levels at which the initial subset of two of the five bits have been programmed into the first and second non-volatile memory cells.

22. The non-volatile memory device of claim 21, wherein each of the first non-volatile memory cell and the second non-volatile memory cell is programmed with first through sixth threshold voltage levels that sequentially increase.

23. The non-volatile memory device of claim 22, wherein each of the non-volatile memory cell pairs store 5-bit data.

24. The non-volatile memory device of claim 21, wherein each of the first non-volatile memory cell and the second non-volatile memory cell is programmed with first through third threshold voltage levels that sequentially increase.

25. The non-volatile memory device of claim 21, wherein each of the first non-volatile memory cell and the second non-volatile memory cell is programmed with first through twelfth threshold voltage levels that sequentially increase.

* * * * *